(12) United States Patent
Yamashita et al.

(10) Patent No.: US 6,486,708 B2
(45) Date of Patent: Nov. 26, 2002

(54) LOGIC CIRCUIT AND ITS FORMING METHOD

(75) Inventors: Shunzo Yamashita, Tokorozawa (JP); Kazuo Yano, Hino (JP); Yasuhiko Sasaki, Menlo Park, CA (US)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/122,385

(22) Filed: Apr. 16, 2002

(65) Prior Publication Data

US 2002/0149394 A1 Oct. 17, 2002

Related U.S. Application Data

(63) Continuation of application No. 09/906,264, filed on Jul. 17, 2001, which is a continuation of application No. 09/610,697, filed on Jul. 5, 2000, now Pat. No. 6,323,690, which is a continuation of application No. 09/197,465, filed on Nov. 23, 1998, now Pat. No. 6,124,736.

(30) Foreign Application Priority Data

Nov. 28, 1997 (JP) .............................................. 9-327536

(51) Int. Cl.⁷ .......................................... H03K 19/094
(52) U.S. Cl. ...................................................... 326/113
(58) Field of Search ................................ 326/113, 104, 326/119, 121, 37, 49, 50; 327/407, 408; 716/1, 3

(56) References Cited

U.S. PATENT DOCUMENTS 5,040,139 A    8/1991   Tran
5,162,666 A   11/1992   Tran
5,200,907 A    4/1993   Tran
5,440,245 A    8/1995   Galbraith et al.
5,504,690 A *  4/1996   Kageyama et al. ............ 716/2
5,600,569 A    2/1997   Nishiyama et al.
5,625,303 A    4/1997   Jamschidi
5,781,033 A    7/1998   Galbraith et al.
5,923,189 A    7/1999   Sasaki et al.
5,977,792 A   11/1999   Mehendale
6,084,437 A    7/2000   Sako
6,185,719 B1   2/2001   Sako

OTHER PUBLICATIONS

IEEE 1994 Custom Integrated Circuits Conference, pp. 603–606.

IEEE Journal of Solid–State Circuits. vol. 25, No. 2, pp. 388–395.

IEEE 1993 International Solid–State Circuits Conference, Digest of Technical Papers, pp. 90–91.

\* cited by examiner

Primary Examiner—Michael Tokar
Assistant Examiner—Vibol Tan
(74) Attorney, Agent, or Firm—Mattingly, Stanger & Malur, P.C.

(57) ABSTRACT

This application proposes a new logic circuit including the 1st selector (S1) in which the control input S is controlled by the first input signal (IN1), the input I1 or I0 is controlled by the second input signal (IN2), and the output O is connected to the first node (N1), and the 3rd selector (S3) in which the control input S is controlled by the first node (N1), the input I1 is controlled by the third input signal (IN3), the input I0 is controlled by the first input signal (IN1), and the output is connected to the first output signal (OUT1).

5 Claims, 19 Drawing Sheets

→ THE PATH WHOSE DELAY SHOULD BE DECREASE

→ THE PATH WHOSE DELAY SHOULD BE DECREASE

LOGIC CIRCUIT AND ITS FORMING METHOD

This is a continuation application of U.S. Ser. No. 09/906,264, filed Jul. 17, 2001, which is a continuation application of U.S. Ser. No. 09/610,697, filed Jul. 5, 2000, now U.S. Pat. No. 6,323,690, which is a continuation application of U.S. Ser. No. 09/197,465, filed Nov. 23, 1998, now U.S. Pat. No. 6,124,736.

BACKGROUND OF THE INVENTION

1. Field of the Invention

The present invention relates to a fast logic circuit formed using selector circuits, as well as a method for forming such the logic circuit.

2. Description of Related Art

There have been published many researches with respect to fast logic circuits so far. Many of those fast logic circuits use pass transistors.

For example, Proceeding of IEEE 1994 Custom Integrated Circuits Conference (pp.603–606) (hereafter, to be referred as document 1) has proposed a method for forming a logic circuit by combining 2-input 1-output pass transistor selectors composed of only n-channel field-effect transistors and delay time improvement buffer inverters respectively. In this case, an object fast logic circuit is successfully formed as a compact circuit provided with less transistors through the use of the characteristics of the pass transistor that can realize a complicated logic function with less transistors.

On the other hand, IEEE Journal of Solid-State Circuits (Vol.25, No.2, pp.388–395) (hereafter, to be referred to as document 2) has proposed a differential fast pass transistor logic circuit, which is referred to as a CPL (Complementary Pass transistor Logic). Just like in the document 1, the CPL logic circuit is composed of 2-input 1-output pass transistor selectors composed of only n-channel field-effect transistors and buffer inverters respectively. The most typical characteristic of the CPL is that two 2-input 1-output pass transistor selectors are always paired so as to be formed as a differential logic circuit that uses signals of both positive and negative polarities. This is different from the technology disclosed in the document 1. Such way, the CPL forms a fast logic circuit by taking advantage of the characteristics of both pass transistor circuit that can realize a complicated logic function with less transistors and differential circuit that requires no inverter for polarity matching. According to the document 2, the CPL has actually realized a full adder 2.5 times faster than a CMOS circuit.

In addition, IEEE International Solid-state Circuits Conference Digest of Technical Papers (pp.90–91, 1993) (hereafter, to be referred to as document 3) has proposed a pass transistor logic circuit referred to as a DPL (Double Pass transistor Logic). Similarly to the CPL, the DPL logic circuit is composed of differential pass transistor selectors so as to use signals of both positive and negative polarities. Unlike the CPL, however, each pass transistor selector is composed of both n-channel and p-channel field-effect transistors. In the case of the pass transistors proposed in the documents 1 and 2, each selector circuit is composed of only n-channel field-effect transistors. Thus, a voltage drop equivalent to the threshold voltage of such a transistor appears at the output of the selector circuit. Consequently, if the supply voltage is low, the circuit cannot operate fast. In the case of the DPL, each selector uses p-channel field-effect transistors together with n-channel field-effect transistors thereby avoiding such a problem of voltage drop equivalent to the threshold voltage value. Consequently, the circuit can operate fast even at a low supply voltage.

Furthermore, U.S. Pat. No. 5,040,139 (hereafter, to be referred to as document 4), U.S. Pat. No. 5,162,666 (hereafter, to be referred to as document 5), and U.S. Pat. No. 5,200,907 (hereafter, to be referred to as document 6) have disclosed methods for forming logic circuits using selectors composed mainly of pass transistor circuits referred to as a TGM circuit (Transmission Gate Multiplexer) respectively. A TGM composed mainly of pass transistor circuits can operate faster than XOR, NAND, and NOR gates composed of a CMOS circuit respectively, so a TGM based logic circuit can operate faster than any of conventional CMOS based logic circuits.

Generally, an actual large logic circuit has a plurality of paths between an input and an output respectively. Consequently, a time required until an output signal is determined (that is, a delay time of the output signal) is decided by the delay time of a (so-called critical) path among the paths, which has the largest total delay time of its elements of a transistor circuit such as a transistor, etc. In addition, if there are a plurality of output signals, the operation speed of a logic circuit is decided by the delay time of the output signal whose delay time is the largest.

Consequently, if there is even one path whose delay time is extremely large, the circuit, as a whole, cannot operate fast even when the delay times of all other paths are very small and they can operate fast. In order to form a large and fast logic circuit actually, therefore, it is very important to make the number of steps in all the paths equal by all means and avoid forming a path having an extremely large delay time when in designing the logic circuit.

In spite of such the circumstances, none of the documents described for the conventional technologies have guaranteed any method for preventing such an extremely slow path from being formed as described above, although those conventional technologies are very effective for improving the operation speed of a circuit itself. Furthermore, none of the documents 1 to 6 mentions any method for forming a logic circuit so as to make the number of steps in all its paths as equal as possible.

And, all the input signals do not arrive necessarily at the same time in an actual circuit; there is always a specific signal, which is often delayed from others. The delay time of the entire logic circuit in such a case becomes the sum of the delay time of the circuit itself and the delay time of the input signal, which is delayed from others. In other words, even when the delay time of an object path is small, if there is any signal which arrives extremely late in the path, then the operation speed of the entire circuit is decided by the operation speed of the path. Consequently, if there is any input signal that is delayed extremely, the logic circuit should be formed so that the number of steps in the path related to the input signal is reduced by all means and the delay times of all the paths in the circuit become equal.

SUMMARY OF THE INVENTION

Under such the circumstances, it is an object of the present invention to provide a fast logic circuit by arranging the number of steps so as to be equal in all the paths of the logical circuit and avoiding existence of a critical path whose delay time is extremely large.

It is another object of the present invention to provide a fast logic circuit formed so that if a specific input signal is far delayed from others, the delay time is taken into account thereby to arrange the number of steps is reduced by all means in the path related to the delayed signal when in forming the object logical circuit.

It is further another object of the present invention to provide a method for forming a logic circuit that can avoid having a critical path whose delay time is extremely large.

It is, further another object of the present invention to provide a method for forming a logic circuit that can avoid having a critical path whose delay time is extremely large by considering an increase of the delay time of a specific input signal, which is expected to be delayed extremely from others.

In order to achieve the above objects, a preferred form of the present invention is a logic circuit (C1 shown in FIG. 1) including: the first selector (S1) in which the control input S is controlled by the first input signal (IN1), and the input signal I1 or I0 is controlled by the second input signal (IN2), and the output O is connected to the first node (N1); and the third selector (S3) in which the control input S is controlled by the first node (N1), the input I1 is controlled by the third input signal (IN3), the input I0 is controlled by the first input signal (IN1), and the output O is connected to the first output signal (OUT1).

Another preferred form of the present invention is a logic circuit (C41 shown in FIG. 2) including: the 41st selector (S41) in which the control input S is controlled by the first input signal (IN1), the input signal I1 is controlled by the third input signal (IN3), and the output O is connected to the 41st node (N41); and the 43rd selector (S43) in which the control input S is controlled by the second input signal (IN2), one of the input I1 and I0 is controlled by the 41st node (N41), the other is controlled by the first input signal (IN1), and the output O is connected to the first output signal (OUT1).

Further another preferred form of the present invention is a logic circuit (C1 shown in FIG. 1) including: the first selector (S1) in which the control input S is controlled by the first input signal (IN1), the input I1 is controlled by the second input signal (IN2), the input I0 is connected to a constant potential (GND), and the output O is connected to the first node (N1); the second selector (S2) in which the control input S is controlled by the first input signal (IN1), the input I1 is controlled by the fourth input signal (IN4), the input I0 is controlled by the fifth input signal (IN5), and the output O is connected to the second node (N2); and the third selector (S3) in which the control input S is controlled by the first node (N1), the input I1 is controlled by the third input signal (IN3), the input I0 is controlled by the second node (N2), and the output O is connected to the first output signal (OUT1).

Further another preferred form of the present invention is a logic circuit (C21 shown in FIG. 1) including: the 21st selector (S21) in which the control input S is controlled by the first input signal (IN1), the input signal I1 is connected to a constant potential (GND), and the input signal I0 is controlled by the second input signal (IN2), and the output O is connected to the 21st node (N21); the 22nd selector (S22) in which the control input S is controlled by the first input signal (IN1), the input I1 is controlled by the fifth input signal (IN5), the input signal I0 is controlled by the fourth input signal (IN4), and the output O is connected to the 22nd node (N22); and the 23rd selector (S23) in which the control input S is controlled by the 21st node (N21), the input I1 is controlled by the third input signal (IN3), the input I0 is controlled by the 22nd node (N22), and the output is connected to the first output (OUT1).

Further another preferred form of the present invention is a logical circuit (C41 shown in FIG. 2) including: the 41st selector (S41) in which the control input S is controlled by the first input signal (IN1), the input I1 is controlled by the third input signal (IN3), the input I0 is controlled by the fifth input signal (IN5), and the output O is connected to the 41st node (N41); the 42nd selector (S42) in which the control input S is controlled by the first input signal (IN1), the input I1 is controlled by the fourth input signal (IN4), the input I0 is controlled by the fifth input signal (IN5), and the output O is connected to the 42nd node (N42); and the 43rd selector (S43) in which the control input S is controlled by the second input signal (IN2), the input I1 is controlled by the 41st node (N41), the input I0 is controlled by the 42nd node (N42), and the output O is connected to the first output signal (OUT1).

Further another preferred form of the present invention is a logical circuit (C51 shown in FIG. 2) including: the 51st selector (S51) in which the control input S is controlled by the first input signal (IN1), the input I1 is controlled by the fifth input signal (IN5), the input I0 is controlled by the third input signal (IN3), and the output O is connected to the 51st node (N51); the 52nd selector (S52) in which the control input S is controlled by the first input signal (IN1), the input I1 is controlled by the fifth input signal (IN5), the input I0 is controlled by the fourth input signal (IN4), and the output O is connected to the 52nd node (N52); and the 53rd selector (S53) in which the control input S is controlled by the second input signal (IN2), the input I1 is controlled by the 51st node (N51), the input I0 is controlled by the 52nd node (N52), and the output O is connected to the first output signal (OUT1).

Further another preferred form of the present invention is a logical circuit (C61 shown in FIG. 2) including: the 61st selector (S61) in which the control input S is controlled by the second input signal (IN2), the input I1 is controlled by the fourth input signal (IN4), the input I0 is controlled by the fifth input signal (IN5), and the output O is connected to the 61st node (N61); the 62nd selector (S62) in which the control input S is controlled by the third input signal (IN3), the input I1 is controlled by the fourth input signal (IN4), the input I0 is controlled by the fifth input signal (IN5), and the output O is connected to the 62nd node (N62); and the 63rd selector (S63) in which the control input S is controlled by the first input signal (IN1), the input I1 is controlled by the 61st node (N61), the input I0 is controlled by the 62nd node (N62), and the output O is connected to the first output signal (OUT1).

Further another preferred form of the present invention is a logical circuit (C71 shown in FIG. 2) including: the 71st selector (S71) in which the control input S is controlled by the third input signal (IN3), the input I1 is controlled by the fourth input signal (IN4), the input I0 is controlled by the fifth input signal (IN5), and the output O is connected to the 71st node (N71); the 72nd selector (S72) in which the control input S is controlled by the first input signal (IN1), the input I1 is controlled by the fourth input signal (IN4), the input I0 is controlled by the 71st node (N71), and the output O is connected to the 72nd node (N72); the 73rd selector (S73) in which the control input S is controlled by the first input signal (IN1), the input I1 is controlled by the fifth input signal (IN5), the input I0 is controlled by the 71st node (N71), and the output O is connected to the 73rd node (N73); and the 74th selector (S74) in which the control input S is controlled by the second input signal (IN2), the input I1 is controlled by the 72nd node (N72), the input I0 is controlled by the 73rd node (N73), and the output O is connected to the first output signal (OUT1).

Further another preferred form of the present invention is a logical circuit (C81 shown in FIG. 2) including: the 81st selector (S81) in which the control input S is controlled by the second input signal (IN2), the input I1 is controlled by the fourth input signal (IN4), the input I0 is controlled by the fifth input signal (IN5), and the output O is connected to the 81st node (N81); the 82nd selector (S82) in which the control input S is controlled by the first input signal (IN1), the input I1 is controlled by the 81st node (N81), the input I0 is controlled by the fourth input signal (IN4), and the output O is connected to the 82nd node (N82); the 83rd selector (S83) in which the control input S is controlled by the first input signal (IN1), the input I1 is controlled by the 81st node (N81), the input I0 is controlled by the fifth input signal (IN5), and the output O is connected to the 83rd node (N83); and the 84th selector (S84), in which the control input S is controlled by the third input signal (IN3), the input I1 is controlled by the 82nd node (N82), the input I0 is controlled by the 83rd node (N83), and the output O is connected to the first output signal (OUT1).

Further another preferred embodiment of the present invention is logic circuits C1, C11, C21, and C31 shown in FIG. 1 and logic circuits C41, C51, C61, C71, and C81 shown in FIG. 2 including respectively a selector (C100 shown in the a-row in FIG. 3), which includes: the 100th n-channel field-effect transistor (TN100) in which the gate is controlled by the 104th node (N104) and a source drain path is connected between the input I0 and the 100th node (N100); the 101st n-channel field-effect transistor (TN101) in which the gate is controlled by the control input S and a source drain path is connected between the input I1 and the 100th node (N100); the 104th p-channel field-effect transistor (TN104) in which the gate is controlled by the control input S and a source drain path is connected between the first operation potential point (VDD) and the 104th node (N104); the 105th n-channel field-effect transistor (TN105) in which the gate is controlled by the control input S and a source drain path is connected between the second operation potential point (GND) and the 104th node (N104); the 102nd p-channel field-effect transistor (TP102) in which the gate is controlled by the 100th node (N100) and a source drain path is connected between the first operation potential point (VDD) and an output; the 103rd n-channel field-effect transistor (TN103) in which the gate is controlled by the 100th node (N100) and a source drain path is connected between the second operation potential point (GND) and an output.

Further another preferred embodiment of the present invention is logic circuits C1, C11, C21, and C31 shown in FIG. 1 and logic circuits C41, C51, C61, C71, and C81 shown in FIG. 2including respectively a selector (C200 shown in the a-row in FIG. 3), which includes: the 200th n-channel field-effect transistor (TN200) in which the gate is controlled by a complementary signal (S') of the control input S and a source drain path is connected between the input I0 and the 200th node (N200); the 201st n-channel field-effect transistor (TN201) in which the gate is controlled by the control input S and a source drain path is connected between the input I1 and the 200th node (N200); the 202nd n-channel field-effect transistor (TN202) in which the gate is controlled by a complementary signal (S') of the control input S and a source drain path is connected between the complementary signal (I0') of the input I0 and the 202nd node (N202); the 203rd n-channel field-effect transistor (TN203) in which the gate is controlled by the control input S and a source drain path is connected between the complementary signal (I1') and the 202nd node (N202); the 206th p-channel field-effect transistor (TP206) in which the gate is controlled by the 200th node (N200) and a source drain path is connected between the first operation potential point (VDD) and a complementary signal (OUT') of an output; the 207th n-channel field-effect transistor (TN207) in which the gate controlled by the 200th node (N200) and a source drain path is connected between the second operation potential point (GND) and a complementary signal (OUT') of an output; the 208th p-channel field-effect transistor (TP208) in which the gate controlled by the 202nd node (N202) and a source drain path is connected between the first operation potential point (VDD) and an output; the 209th n-channel field-effect transistor (TN209) in which the gate is controlled by the 202th node (N202) and a source drain path is connected between the second operation potential point (GND) and an output.

Further another preferred embodiment of the present invention is a logic circuit (C120 shown in FIG. 4), which includes: the 127th p-channel field-effect transistor (TP127) in which the gate is controlled by the first input signal (IN1) and a source drain path is connected between the first operation potential point (VDD) and the 127th node (N127); the 127th n-channel field-effect transistor (TN127) in which the gate is controlled by the first input signal (IN1) and a source drain path is connected between the second operation potential point (GND) and the 127th node (N127);

the 128th n-channel field-effect transistor (TN128) in which the gate is controlled by the 127th node (N127) and a source drain path is connected to the 126th node (N128); the 129th n-channel field-effect transistor (TN129) in which the gate is controlled by the first input signal (IN1) and a source drain path is connected between the second input signal (IN2) and the 128th node (N128);

the 121st p-channel field-effect transistor (TP121) in which the gate is controlled by the 128th node (N128) and a source drain path is connected between the first operation potential point (VDD) and the 121st node (N121); the 121st n-channel field-effect transistor (TN121) in which the gate is controlled by the 121st node (N121) and a source drain path is connected between the second operation potential point (GND) and the 121th node (N121);

the 125th p-channel field-effect transistor (TP125) in which the gate is controlled by the 121st node (N121) and a source drain path is connected between the third input signal (IN3) and the 125th node (N125); the 126th n-channel field-effect transistor (TN126) in which the gate is controlled by the 128th node (N128) and a source drain path is connected between the 124th code (N124) controlled by the first input signal (IN1), and the 125the node (N125).

Further another preferred embodiment of the present invention is a logic circuit (C120 shown in the a-row in FIG. 4), which includes: the 120th p-channel field-effect transistor (TP120) in which the gate is controlled by the first input signal (IN1) and a source drain path is connected between the first operation potential point (VDD) and the 120th node (N120);

the 120th n-channel field-effect transistor (TN120) in which the gate is controlled by the first input signal (IN1) and a source drain path is connected between the second operation potential point (GND) and the 120th node (N120);

the 123rd n-channel field-effect transistor (TN123) in which the gate is controlled by the 120th node (N120) and a source drain path is connected between the fifth input signal (IN5) and the 124th node (N124); the 124th n-channel field-effect transistor (TN124) in which the gate is controlled by the first input signal (IN1) and a source drain path is connected between the fourth input signal (IN4) and the 124th node (N124);

the 121st p-channel field-effect transistor (TP121) in which the gate is controlled by the 130th node (N130) and a source drain path is connected between the first operation potential point (VDD) and the 121st node (N121); the 121st n-channel field-effect transistor (TN121) in which the gate is controlled by the 130th node (N130) and a source drain path is connected between the second operation potential point (GND) and the 121st node (N121);

the 125th n-channel field-effect transistor (TN125) in which the gate is controlled by the 121st node (N121) and a source drain path is connected between the third input signal (IN3) and the 125th node (N125); the 126th n-channel field-effect transistor (TN126) in which the gate is controlled by the 130th node (N130) and a source drain path is connected between the 124th node (N124) and the 125th node (N125);

the 127th p-channel field-effect transistor (TP127) in which the gate is controlled by the first input signal (IN1) and a source drain path is connected between the first operation potential point (VDD) and the 127th node (N127); the 127th n-channel field-effect transistor (TN127) in which the gate is controlled by the first input signal (IN1) and a source drain path is connected between the second operation potential point (GND) and the 127th node (N127);

the 128th n-channel field-effect transistor (TN128) in which the gate is controlled by the 127th node (N127) and a source drain path is connected between the first (VDD) or second operation point (GND) and the 128th node (N128); the 129th n-channel field-effect transistor (TN129) in which the gate is controlled by the first input signal (IN1) and a source drain path is connected between the second input signal (IN2) and the 128th node (N128);

the 130th p-channel field-effect transistor (TP130) in which the gate is controlled by the 128th node (N128) and a source drain path is connected between the first operation potential point (VDD) and the 130th node (N130); the 130th n-channel field-effect transistor (TN130) in which the gate is controlled by the 128th node (N128) and a source drain path is connected between the second operation potential point (GND) and the 130th node (N130);

the 122nd p-channel field-effect transistor (TP122) in which the gate is controlled by the 125th node (N125) and a source drain path is connected between the first operation potential point (VDD) and the first output signal (OUT1); the 122nd n-channel field-effect transistor (TN122) in which the gate is controlled by the 125th node (N125) and a source drain path is connected between the second operation potential point (GND) and the first output signal (OUT1).

Further another preferred embodiment of the present invention is a logic circuit (C140 shown in the a-row in FIG. 5), which includes: the 140th p-channel field-effect transistor (TP140) in which the gate is controlled by the first input signal (IN1) and a source drain path is connected between the first operation potential point (VDD) and the 140th node (N140); the 140th n-channel field-effect transistor (TN140) in which the gate is controlled by the first input signal (IN1) and a source drain path is connected between the second operation potential point (GND) and the 140th node (N140);

the 143rd n-channel field-effect transistor (TN143) in which the gate is controlled by the 140th node (N140) and a source drain path is connected between the fourth input signal (IN4) and the 144th node (N144); the 144th n-channel field-effect transistor (TN144) in which the gate is controlled by the first input signal (IN1) and a source drain path is connected between the fifth input signal (IN5) and the 144th node (N144);

the 141st p-channel field-effect transistor (TP141) in which the gate is controlled by the 150th node (N150) and a source drain path is connected between the first operation potential point (VDD) and the 141st node (N141); the 141st n-channel field-effect transistor (TN141) in which the gate is controlled by the 150th node (N150) and a source drain path is connected between the second operation potential point (GND) and the 141st node (N141);

the 145th n-channel field-effect transistor (TN145) in which the gate is controlled by the 141st node (N141) and a source drain path is connected between the third input signal (IN3) and the 145th node (N145); the 146th n-channel field-effect transistor (TN146) in which the gate is controlled by the 150th node (N150) and a source drain path is connected between the 144th node (N144) and the 145th node (N145);

the 147th p-channel field-effect transistor (TP147) in which the gate is controlled by the first input signal (IN1) and a source drain path is connected between the first operation potential point (VDD) and the 147th node (N147); the 147th n-channel field-effect transistor (TN147) in which the gate is controlled by the first input signal (IN1) and a source drain path is connected between the second operation potential point (GND) and the 147th node (N147);

the 148th n-channel field-effect transistor (TN148) in which the gate is controlled by the 147th node (N147) and a source drain path is connected between the second input signal (IN2) and the 148th node (N148); the 149th n-channel field-effect transistor (TN149) in which the gate is controlled by the first input signal (IN1) and a source drain path is connected between the first operation potential point (VDD) or the second operation potential point (GND) and the 148th node (N148);

the 150th p-channel field-effect transistor (TP150) in which the gate is controlled by the 148th node (N148) and a source drain path is connected between the first operation potential point (VDD) and the 150th node (N150); the 150th n-channel field-effect transistor (TN150) in which the gate is controlled by the 148th node (N148) and a source drain path is connected between the second operation potential point (GND) and the 150th node (N150);

the 142nd p-channel field-effect transistor (TP142) in which the gate is controlled by the 145th node (N145) and a source drain path is connected between the first operation potential point (VDD) and the first output signal (OUT1); the 142nd n-channel field-effect transistor (TN142) in which the gate is controlled by the 145th node (N145) and a source drain path is connected between the second operation potential point (GND) and the first output signal (OUT1).

Further another preferred embodiment of the present invention is a logic circuit (C160 shown in the a-row in FIG. 11), which includes: the 160th p-channel field-effect transistor (TP160) in which the gate is controlled by the first input signal (IN1) and a source drain path is connected between the first operation potential point (VDD) and the 160th node (N160); the 160th n-channel field-effect transistor (TN160) in which the gate is controlled by the first input signal (IN1) and a source drain path is connected between the second operation potential point (GND) and the 160th node (N160);

the 163rd n-channel field-effect transistor (TN163) in which the gate is controlled by the 160th node (N160) and a source drain path is connected between the fifth input signal (IN5) and the 163rd node (N163); the 164th n-channel field-effect transistor (TN164) in which the gate is controlled by the first input signal (IN1) and a source drain path is connected between the fourth input signal (IN4) and the 163rd node (N163);

the 161st p-channel field-effect transistor (TP161) in which the gate is controlled by the 168th node (N168) and a source drain path is connected between the first operation potential point (VDD) and the 161st node (N161); the 161st n-channel field-effect transistor (TN161) in which the gate is controlled by the 168th node (N168) and a source drain path is connected between the second operation potential point (GND) and the 161st node (N161);

the 165th n-channel field-effect transistor (TN165) in which the gate is controlled by the 161st node (N161) and a source drain path is connected between the third input signal (IN3) and the 165th node (N165); the 166th n-channel field-effect transistor (TN166) in which the gate is controlled by the 168th node (N168) and a source drain path is connected between the 163rd node (N163) and the 165th node (N165);

the 167th p-channel field-effect transistor (TP167) in which the gate is controlled by the first input signal (IN1) and a source drain path is connected between the first operation potential point (VDD) and the 168th node (N168); the 168th p-channel field-effect transistor (TP168) in which the gate is controlled by the second input signal (IN2) and a source drain path is connected between the first operation potential point (VDD) and the 168th node (N168); the 167th n-channel field-effect transistor (TN167) in which the gate is controlled by the second input signal (IN2) and a source drain path is connected between the 168th node (N168) and the 167th node (N167); the 167th n-channel field-effect transistor (TN167) in which the gate is controlled by the first input signal (IN1) and a source drain path is connected between the second operation potential point (GND) and the 167th node (N167);

the 162nd p-channel field-effect transistor (TP162) in which the gate is controlled by the 165th node (N165) and a source drain path is connected between the first operation potential point (VDD) and the first output signal (OUT1); and the 162nd n-channel field-effect transistor (TN162) in which the gate is controlled by the 165th node (N165) and a source drain path is connected between the second operation potential point (GND) and the first output signal (OUT1).

Further another preferred embodiment of the present invention is a logic circuit (C180 shown in the a-row in FIG. 12), which includes: the 184th p-channel field-effect transistor (TP184) in which the gate is controlled by the first input signal (IN1) and a source drain path is connected between the first operation potential point (VDD) and the 185th node (N185); the 185th p-channel field-effect transistor (TP185) in which the gate is controlled by the second input signal (IN2) and a source drain path is connected between the first operation potential point (VDD) and the 185th node (N185); the 184th n-channel field-effect transistor (TN184) in which the gate is controlled by the second input signal (IN2) and a source drain path is connected between the 185th node (N185) and the 184th node (N184); the 185th n-channel field-effect transistor (TN185) in which the gate is controlled by the first input signal (IN1) and a source drain path is connected between the second operation potential point (GND) and the 184th node (N184);

the 180th p-channel field-effect transistor (TP180) in which the gate is controlled by the 185th node (N185) and a source drain path is connected between the first operation potential point (VDD) and the 180th node (N180); the 180th n-channel field-effect transistor (TN180) in which the gate is controlled by the 185th node (N185) and a source drain path is connected between the second operation potential point (GND) and the 180th node (N180);

the 182nd n-channel field-effect transistor (TN182) in which the gate is controlled by the 180th node (N180) and a source drain path is connected between the third input signal (IN3) and the 182nd node (N182); the 183rd n-channel field-effect transistor (TN183) in which the gate is controlled by the 185th node (N185) and a source drain path is connected between the first input signal (IN1) and the 182nd node (N182); the 181st p-channel field-effect transistor (TP181) in which the gate is controlled by the 182nd node (N182) and a source drain path is connected between the first operation potential point (VDD) and the first output signal (OUT1); the 181st n-channel field-effect transistor (TN181) in which the gate is controlled by the 182nd node (N182) and a source drain path is connected between the second operation potential point (GND) and the first output signal (OUT1).

DESCRIPTION OF THE PREFERRED EMBODIMENTS

Hereunder, the logic circuits of the present invention will be described in detail with reference to some embodiments shown in the accompanying drawings. The same reference numbers will be used in those accompanying drawings to indicate the same items or similar items.

<First Embodiment>

At first, an embodiment of the present invention will be described in accordance with the a-row shown in FIG. 1. Each of the selectors (S5 and S6 of C0 and S1 to S3 of C1, etc.) shown in the a-row in FIG. 1 has a logic function shown with a Boolean expression (E100 in the a-row) in FIG. 3. In other words, if the value of the control input S is "1", the input I1 is selected and an object input signal is output to the output O. If the value of the control input S is "0", the input I0 is selected and the object input signal is output to the output O. In each of the circuits C100 to C102 shown in FIG. 3, for example, this 2-input 1-output selector is composed of various types of circuits. Of those circuits C100 to C102, the circuit C100 has a selector part (transistors T100 and T101) composed only of n-channel field-effect transistors. The circuit C100 is shown in the reference document 1. In this circuit C100, transistors T102, T103, and T106 are inserted as buffers so as to be used mainly for reducing the delay time of the circuit. These transistors are omissible if another selector circuit is provided in the following stage.

Figure 3:
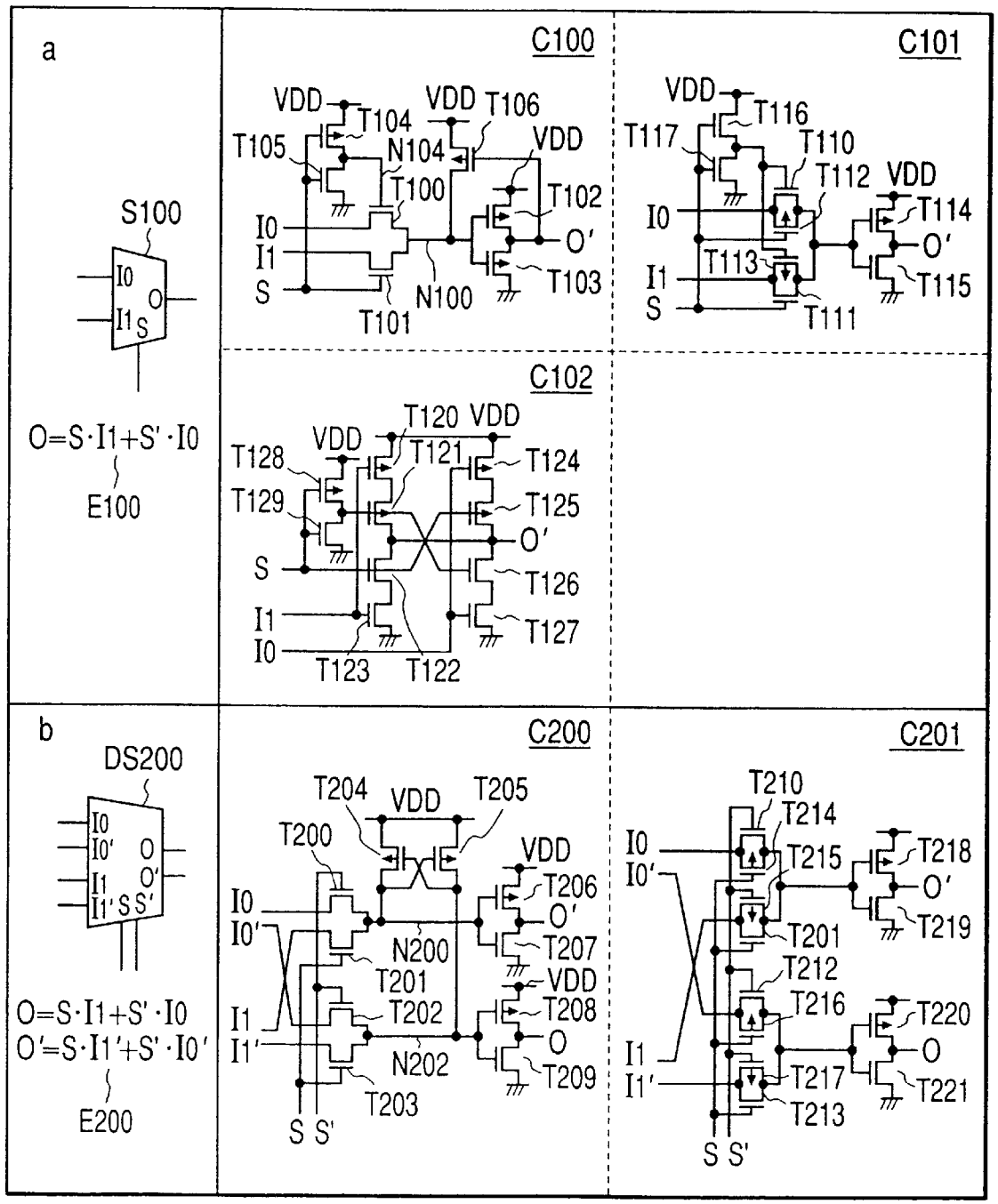
FIG. 3 is a circuit diagram of a selector.

In the circuit C101 shown in the a-row in FIG. 3, the selector part is composed, for example, of both n-channel field-effect transistors and p-channel field-effect transistors. Unlike the circuit C100, no voltage drop equivalent to the threshold voltage value occurs in the selector part (T110 to T113) in this circuit. Thus, even when the supply voltage is low, the circuit can operate fast. In addition, the circuit C102 shown in the a-row in FIG. 3 is composed of a CMOS circuit. As understood from this case, generally, a compact selector circuit can be formed more easily if it is composed of a pass transistor circuit.

Hereunder, the delay time of the circuit C0 shown in FIG. 1 will be described. This circuit has the following paths:

C0 path 1 IN5→selector S6→OUT1

C0 path 2 IN4→selector S5 N5→selector S6→OUT1

C0 path 3 IN3→selector S5→N5→selector S6→OUT1

C0 path 4 IN2→selector S5→N5→selector S6→OUT1

C0 path 5 IN1→selector S6→OUT1

Next, description will be made for a case that only the input signal IN3 is delayed extremely from others (IN1, IN2, IN4, and IN5). For example, if INS3 is delayed by 1.0 ns and other selectors S5 and S6 are delayed by 0.5 ns respectively, the delay time of each path will be as shown below:

C0 path 1 0+0.5 0.5 ns

C0 path 2 0+0.5+0.5 1.0 ns

C0 path 3 1.0+0.5+0.5 2.0 ns

C0 path 4 0+0.5+0.5–1.0 ns

C0 path 1 0.5 0.5 ns

Figure 1:
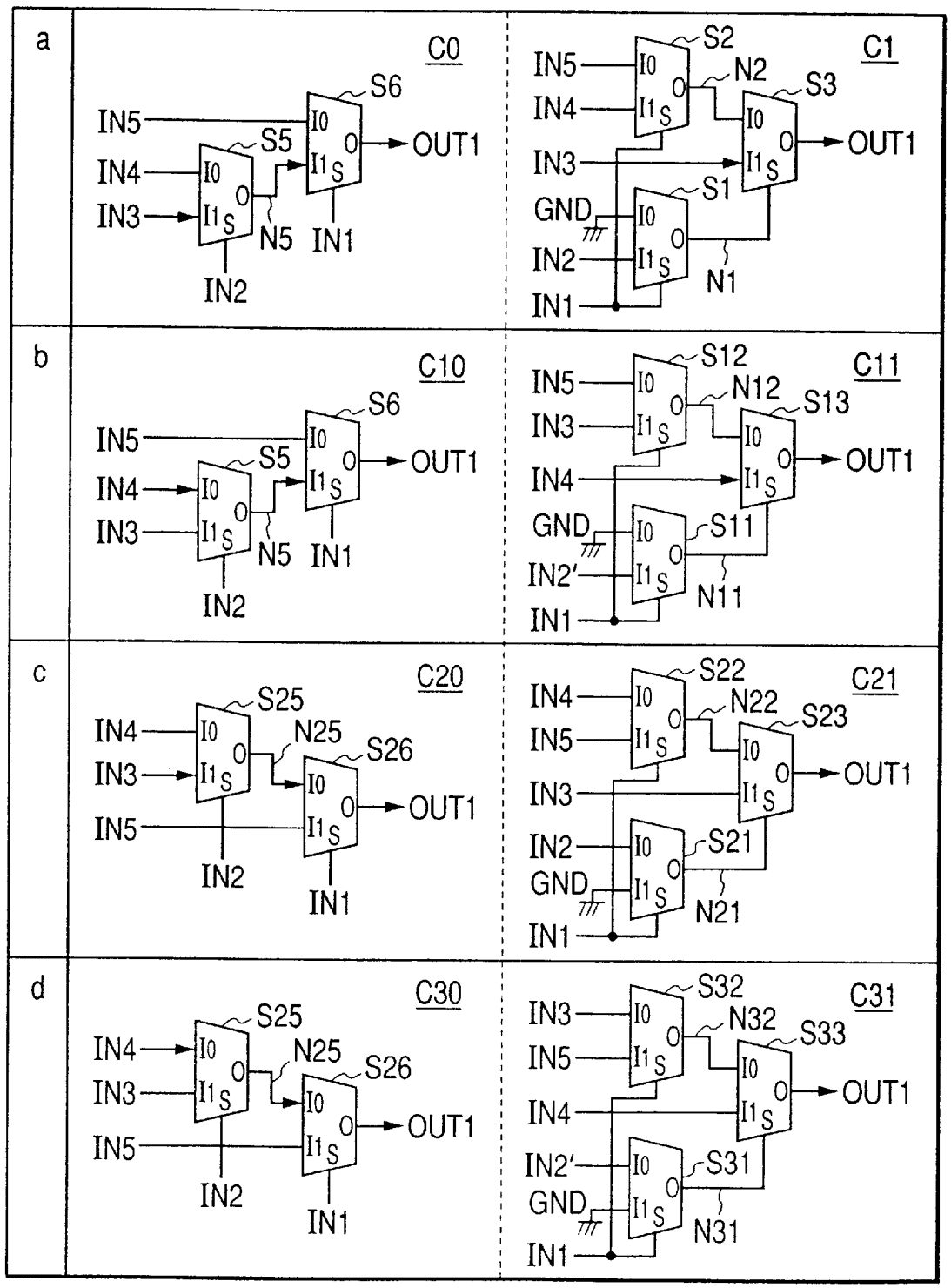
FIG. 1 shows an embodiment of the present invention.

In other words, the path of IN3→S5→N5→S6→OUT1 shown with a thick line becomes a critical path having the largest delay time in the circuit C0 shown in FIG. 1. This is why the delay time of the entire circuit C0 becomes 2.0 ns, which is none other than the delay time of this critical path, although other paths can operate faster than 2.0 ns. This is because the path between this IN3 and an output has two selectors (S5 and S6) disposed in two stages, while IN3 is delayed from other input signals in this circuit C0. As a result, the delay time of this path becomes extremely large (1.0 ns larger than those of other paths in this case), so that the delay time of the entire circuit also becomes large.

On the contrary, according to the logic circuit C1 of the present invention shown in FIG. 1, the path between IN3 and OUT1 has only one selector (S3), although the circuit C1 has the same logic function as that of the circuit C0.

Consequently, the circuit C1 can operate fast. Actually, this circuit C1 has the following paths:

C1 path 1 IN5→selector S2→N2→selector S3→OUT1
C1 path 2 IN4→selector S2→N2→selector S3→OUT1
C1 path 3 IN1→selector S2→N2→selector S3→OUT1
C1 path 4 IN3→selector S3→OUT1

C1 path 5 IN2→selector S1→N1→selector S3→OUT1 C1 path 6 IN1→→selector S1→N1→selector S3→OUT1

The delay time of each path will be estimated as follows.

C1 path 1 0+0.5+0.5 1.0 ns
C1 path 2 0+0.5+0.5 1.0 ns
C1 path 3 0+0.5+0.5 1.0 ns
C1 path 4 1.0+0.5 1.5 ns
C1 path 5 0+0.5+0.5 1.0 ns
C1 path 6 0+0.5+0.5 1.0 ns Just like the circuit C0, the path between IN3 and OUT1 becomes a critical path having the largest delay time. However, since the delay time is 1.5 ns, the circuit C1 can operate faster than the circuit C0 by 0.5 ns, that is, 25% up.

The circuits C0 and C1 shown in FIG. 1 have the same Boolean expression as shown below, so it is proved that both of the circuits C0 and C1 have the same logic function. The Boolean expression of the circuit C0 will be as shown below in accordance with the notation of the Boolean expression (E100 in FIG. 3) represented for a 2-input 1-output selector circuit.

$$OUT\ 1 = IN1 \cdot N101 + IN1' \cdot IN5 \quad (E0)$$
$$= IN1 \cdot (IN2 \cdot IN3 + IN2' \cdot IN4) + IN1' \cdot IN5$$
$$= IN1 \cdot IN2 \cdot IN3 + IN1 \cdot IN2' \cdot IN4 + IN1' \cdot IN5$$

In the same way, the Boolean expression of the circuit C1 will be represented as shown below.

$$OUT\ 1 = N1 \cdot IN3 + N1' \cdot N2 \quad (E1)$$
$$= (IN1 \cdot IN2) \cdot IN3 + (IN1 \cdot IN2)' \cdot (IN1 \cdot IN4 + IN1' \cdot IN5)$$
$$= IN1 \cdot IN2 \cdot IN3 + (IN1' + IN2') \cdot (IN1 \cdot IN4 + IN1' \cdot IN5)$$
$$= IN1 \cdot IN2 \cdot IN3 + IN1 \cdot IN2' \cdot IN4 + IN1' \cdot IN5 + IN1' \cdot IN2' \cdot IN5$$
$$= IN1 \cdot IN2 \cdot IN3 + IN1 \cdot IN2' \cdot IN4 + IN1' \cdot IN5$$

The expressions (E0) and (E1) are completely the same in pattern. It will thus be understood that C0 and C1 have completely the same logic function. In the above Boolean expressions, IN1' is an NOR of IN1, indicating a complementary signal of IN1 (the same will also go for the subsequent Boolean expressions).

If the input signal IN3 is entered lately to the circuit C0 shown in FIG. 1 such way, the circuit C0 should be replaced with the logic circuit (C1) of the present invention. Then, the number of steps will be reduced in the path between IN3 and OUT1, so that the circuit can operate faster.

Figure 4:
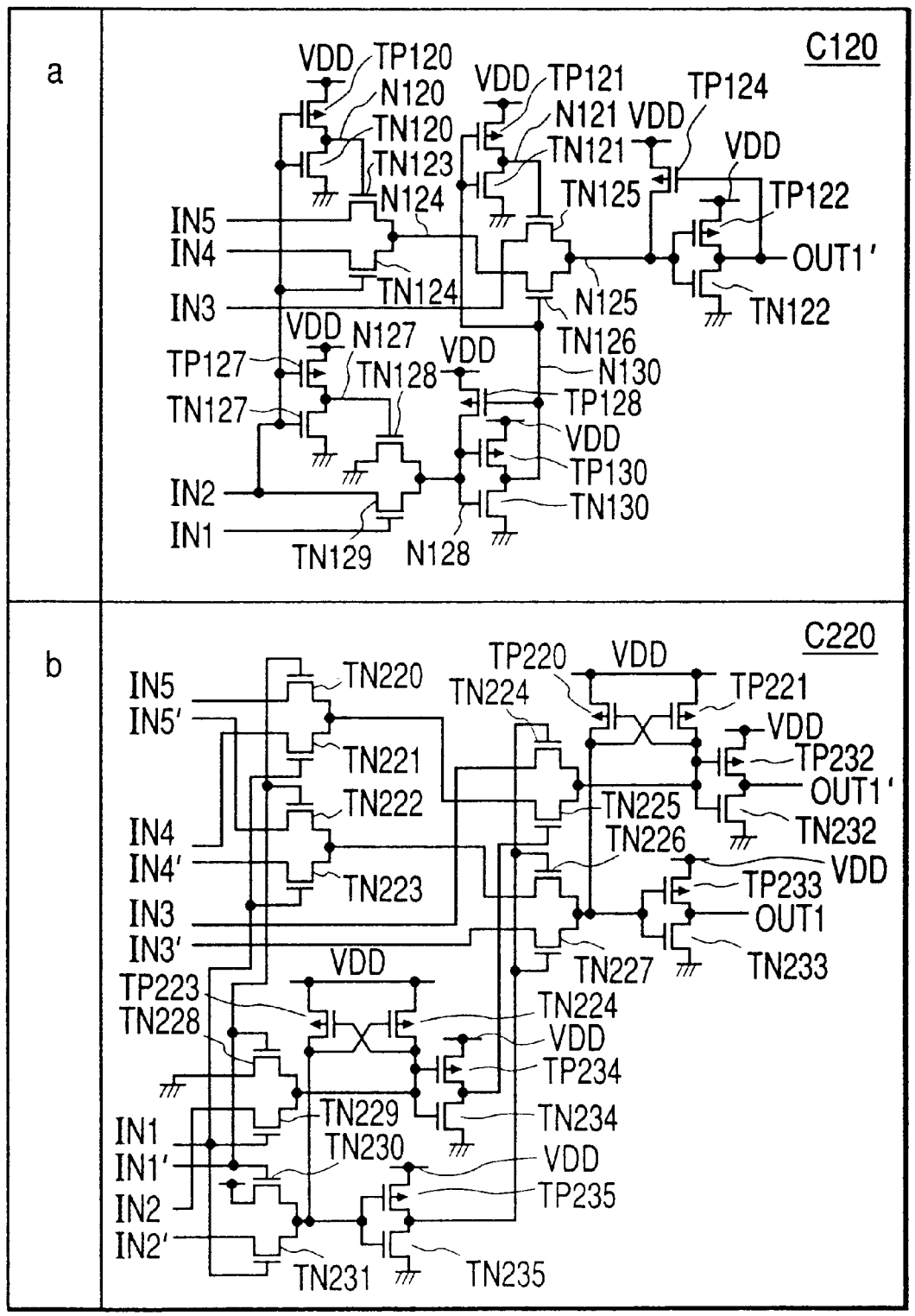
FIG. 4 shows another embodiment of the present invention.

If the circuit C1 is represented as a transistor circuit after the selector is composed of a C100 type circuit shown in FIG. 3, the circuit will become like C120 shown in the a-row in FIG. 4, wherein the circuit is composed of transistors TN120 to TN130, as well as TP120 to TP130.

In the above case, each delay time is estimated premising that the delay time between the control input S and the output O of a selector is equal to the delay time between the signal input I0 or I1 and the output O. If a selector is composed of any of circuits C100 to C102 shown in the a-row in FIG. 3, however, the delay time from the control input is increased according to the delay time of the internal polarity inverter (e.g., T104 to T105 in C100). In a typical case, the delay time from any of the signal inputs I1 and I0 is 0.3 ns. And, the delay time from the control input S becomes 0.5 ns or so. If a pass transistor selector is composed of a differential circuit shown as C200 and C201 in FIG. 3, however, the polarity inverter is omissible. Because, signals in such a differential circuit always make a pair of positive and negative polarities.

Consequently, the delay time from the control input S is reduced significantly. Concretely, the delay time becomes almost the same as the delay time from any of the signal inputs I1 and I0 or it becomes a little smaller than the delay time from any of the I1 and I0. If a logic circuit of the present invention is composed of a differential pass transistor circuit, therefore, the circuit will further be faster in operation.

In the circuit C200 shown in FIG. 3, the selector part is composed of only n-channel field-effect transistors. The circuit is called a CPL, which is proposed in the reference document 2. Just as is the case with the circuits C100 and C101 shown in FIG. 3, transistors T204 to T209 in this circuit C200 are used as buffer circuits. They are omissible if another selector is provided in the next stage. On the other hand, in the circuit C201 shown in FIG. 3, the selector part is composed of both n-channel and p-channel field-effect transistors. This circuit can operate fast just like the circuit C101 shown in the a-row in FIG. 3 even when the supply power is low.

This circuit C1 can be composed of a differential selector C200 shown in FIG. 3 so as to be converted to the circuit C220 shown in the b-row in FIG. 4, wherein the circuit is composed of transistors TN220 to TN235, as well as TP220 to TP235. When compared with the circuit C120 shown in the a-row in FIG. 4, it will be understood that the circuit will operates faster, because no polarity inverter is needed in the control input part of the selector.

Generally, circuit characteristics including delay time, etc. are often improved furthermore if one of the two inputs I0 and I1 is fixed at GND or VDD and the pass transistor selectors (selectors S300 to S330 shown in the a-row to the d-row in FIG. 6), which function as an AND logic gate or an OR logic gate respectively, are replaced with a NAND gate, a NOR gate, etc. (G300 to G331 shown in the a-row to the d-row in FIG. 6) composed of a CMOS circuit having equivalent logic functions. (For example, refer to Proceeding of 1997 The Symposium on VLSI circuits (pp.31–32). Hereafter, to be referred as document 7.) The NAND gate, the NOR gate, and the inverter indicated as G300 to G331 in FIG. 6 are composed of a standard CMOS circuit indicated as G340 (transistors T340 to T343), G350 (transistors T350 to T353), and G360 (transistors T360 to T363) respectively.

Figure 6:
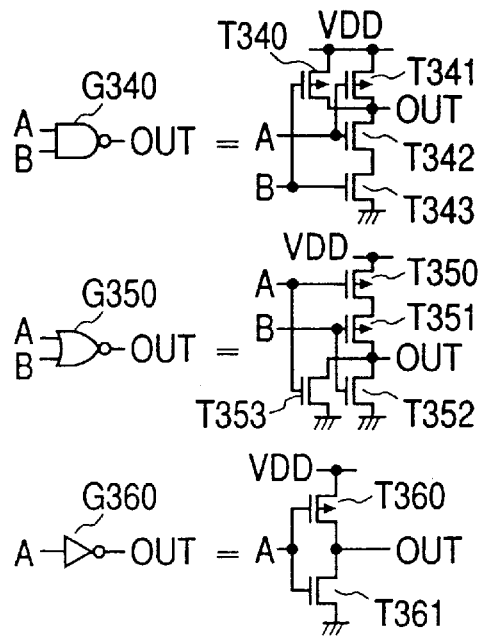
FIG. 6 shows patterns of a selector converted to a NAND gate, a NOR gate, and an inverter respectively, as well as the conversion rules.
Figure 7:
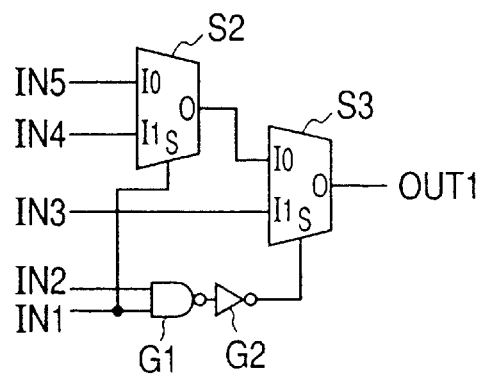
FIG. 7 is a circuit diagram of a logic circuit C1 of the present invention shown in FIG. 1, in which the selector S1 is replaced with a NAND gate+an inverter in accordance with the convertation rules shown in the a-row in FIG. 6.

In the circuit C1 shown in FIG. 1, the selector S1 is equivalent to the selector S300 shown in the a-row in FIG. 6. The circuit C1 can thus be replaced with a NAND gate+an inverter (refer to the conversion pattern in the a-row in FIG. 6). The circuit C1 can thus be converted to the circuit shown in FIG. 7. As for the operations of the inverter G2 and the selector S3 in the circuit shown in FIG. 7, if "1" is entered to the inverter G2, "0" is entered to the control input of the selector S3. The selector thus selects I1. If "0" is entered to the inverter G2, "1" is entered to the control input of the selector S3. The selector S3 thus selects I0.

Figure 8:
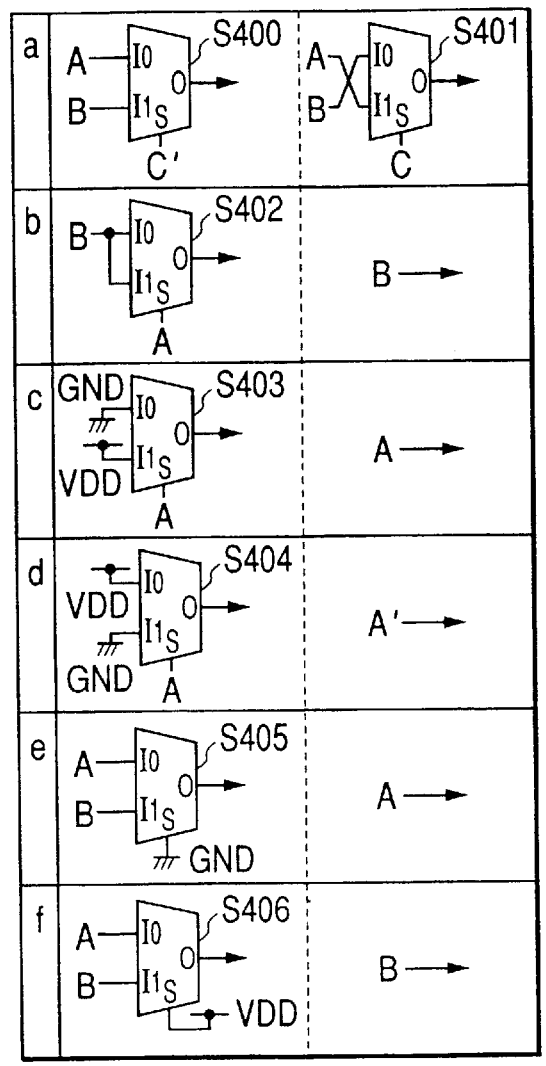
FIG. 8 shows redundant selectors.

In other words, if the connections of I0 and I1 are changed in the selector S3, the inverter G2 is omissible (as shown in the a-row in FIG. 8). Consequently, the circuit C1 shown in FIG. 1 can be converted finally to the circuit C2 shown in the a-row in FIG. 10. Generally, the delay time of a 2-input NAND gate (G1) is smaller than the delay time of a selector. If the delay time of a selector is 0.5 ns or so, for example, the delay time of a 2-input NAND gate (G1) is 0.2 ns or so. The delay time of this circuit C2 can be estimated as follows:

C2 path 1 IN5→S2→S3→OUT1 0+0.5+0.5=1.0 ns
C2 path 2 IN4→S2→S3→OUT1 0+0.5+0.5=1.0 ns
C2 path 3 IN1→S2→S3→OUT1 0+0.5+0.5=1.0 ns
C2 path 4 IN3→S3→OUT1 1.0+0.5=1.5 ns
C2 path 5 IN2→G1→S3→OUT1 0+0.2+0.5=0.7 ns
C2 path 6 IN2→G1→S3→OUT1 0+0.2+0.5=0.7 ns Consequently, the delay time of the critical path (path 4) becomes 1.5 ns, which is the same as that of the circuit C1. However, since the delay times of the paths 5 and 6 are reduced, this circuit C2 is faster in operation in a case in which both IN3 and IN2 are delayed together. Actually, if IN2 is delayed by 0.6 ns, the delay time of the circuit C1 is estimated as follows; C1 path 5 . . . 0.6+0.5+0.5=1.6 ns. The path 5 thus becomes a critical path. The delay time of 1.5 ns makes the circuit C1 delay in operation by 0.1 ns, which disables the operation of the circuit C1 itself. On the other hand, the delay time of the circuit C2 is estimated as follows; path 5 . . . 0.6+0.2+0.5=1.3 ns. The path 4 thus remains to be a critical path. The circuit operation is thus enabled within a delay time of 1.5 ns.

If some selectors of a logical circuit of the present invention are replaced with NAND gates and NOR gates composed of a CMOS circuit respectively such way, the logic circuit will be able to reduce the delay time furthermore.

Figure 11:
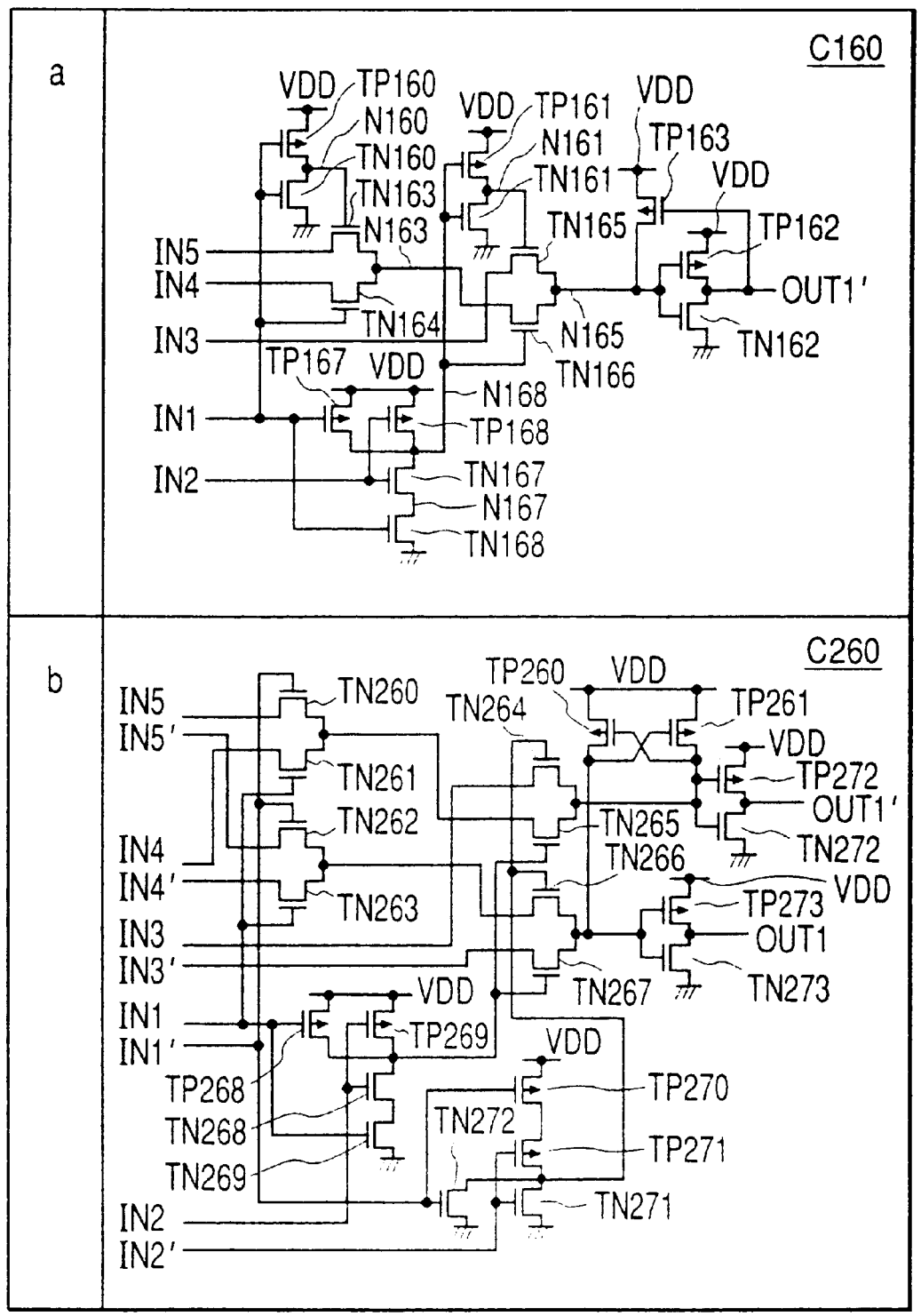
FIG. 11 shows transistor circuit diagrams of the logic circuits C2 and C3 of the present invention shown in the a-row in FIG. 10.

For a C100 type selector shown in FIG. 3, this circuit C2 could be represented as a transistor circuit C160 as shown in the a-row in FIG. 11, wherein the circuit C2 is composed of transistors TN160 to TN168, as well as TP160 to TP168.

Figure 9:
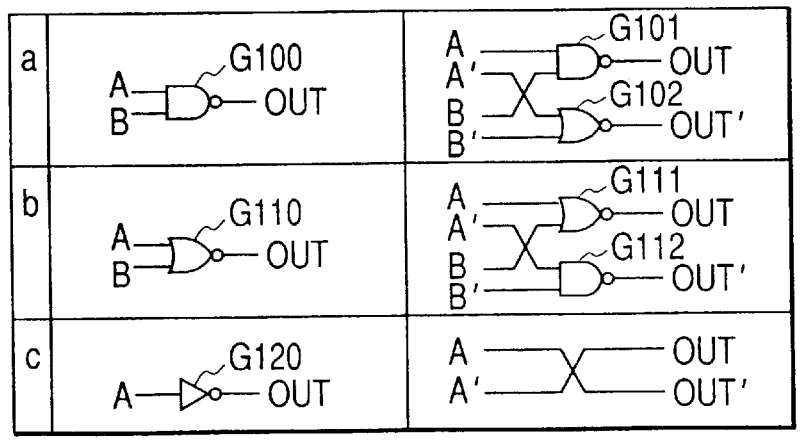
FIG. 9 shows a NAND gate, a NOR gate, and an inverter composed of a differential circuit respectively.
Figure 10:
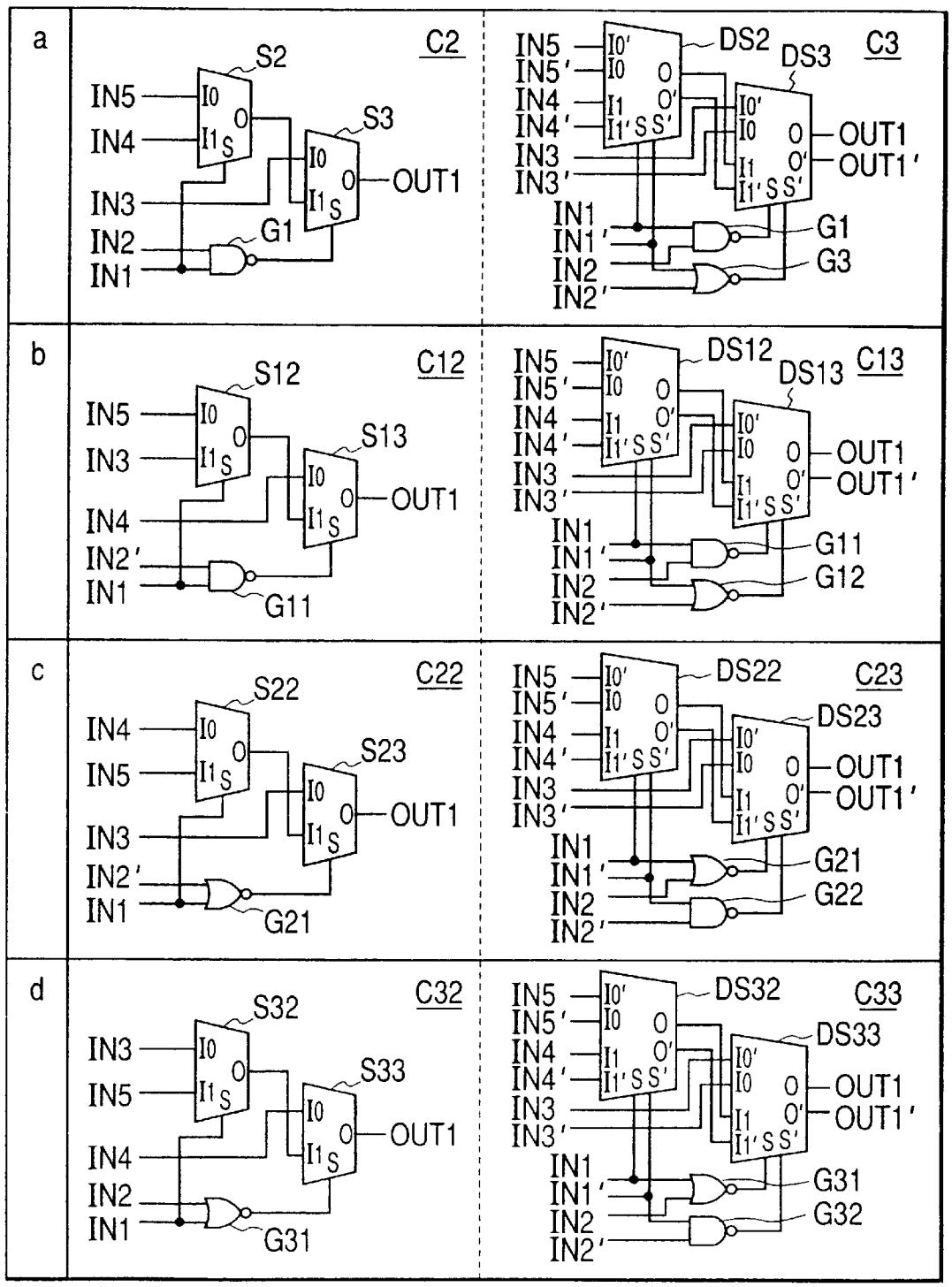
FIG. 10 shows logic circuits C1, C11, C21, and C31 of the present invention shown in FIG. 1, in each of which some selectors are replaced with CMOS gates in accordance with the convertation rules shown in FIG. 6 and each of those logic circuits composed of a differential circuit.

Even when a differential selector is used, the logic circuit operation can further become faster by combining the selector with a CMOS circuit. In this case, it is possible to replace each of the NAND and NOR gates composed of a CMOS circuit with a differential circuit as shown in the a- to c-rows shown in FIG. 9. For example, the NAND gate G1 in the circuit C2 shown in FIG. 10 is equivalent to the circuit shown in the a-row in FIG. 9, so it is only needed to replace it with the NAND gate and a NOR gate in this case. The circuit C2 shown in the a-row in FIG. 10 can be replaced with a differential circuit such way, thereby to obtain the circuit C3 shown in the a-row in FIG. 10. If the delay time of the circuit C3 is estimated assuming that the delay time of the path between any of the selector signal inputs I1 and I0 and the output O is 0.3 ns, the delay time from the control input S is 0.2 ns, and the delay time of any of the NAND and NOR gates is 0.3 ns, then the result will be as shown below.

C3 path 1 IN5→DS2→DS3→OUT1 0+0.3+0.3=0.6 ns
C3 path 2 IN4→DS2→DS3→OUT1 0+0.3+0.3=0.6 ns
C3 path 3 IN1→DS2→DS3→OUT1 0+0.2+0.3=0.5 ns
C3 path 4 IN3→DS3→OUT1 1.0+0.3=1.3 ns
C3 path 5 IN1→G1, G3→DS3→OUT1 0+0.3+0.2=0.5 ns
C3 path 6 IN2→G1, G3→DS3→OUT1 0+0.3+0.2=0.5 ns The circuit operation can further become faster than the circuits C1 and C2. If each selector is composed of a C200 type circuit shown in FIG. 3 in this circuit C3, the circuit (transistor circuit) will be converted to a circuit composed of transistors TN260 to TN273, as well as TP260 to TP273. The circuit is shown as C260 in the b-row in FIG. 11.

Next, description will be made for a case that the input signals IN5 and IN4 are fixed at GND and at VDD respectively. In this case, the selector S1 of the circuit C2 is set so that I0 and I1 are fixed at GND and VDD respectively. The selector is thus equivalent to the selector S403 shown in the c-row in FIG. 8. The operation of this selector S1 is as follows; if the control input S is "0", a GND potential, that is, "0" is output and if the control input S is "1", a VDD potential, that is, "1" is output. This selector is thus redundant and can be removed. The selector can also be simplified into a circuit shown as C181 in the a-row in FIG. 12. This circuit C181 has not a path of IN1→S2→S3→OUT1, which exists in the circuit C2, so the circuit C191 can operate faster than the circuit C2. Generally, if there are selectors (S402 to S406) shown in the b- to f-rows in FIG. 8 in a logic circuit, those selectors can be removed to simplify the logic circuit for faster operation.

Figure 12:
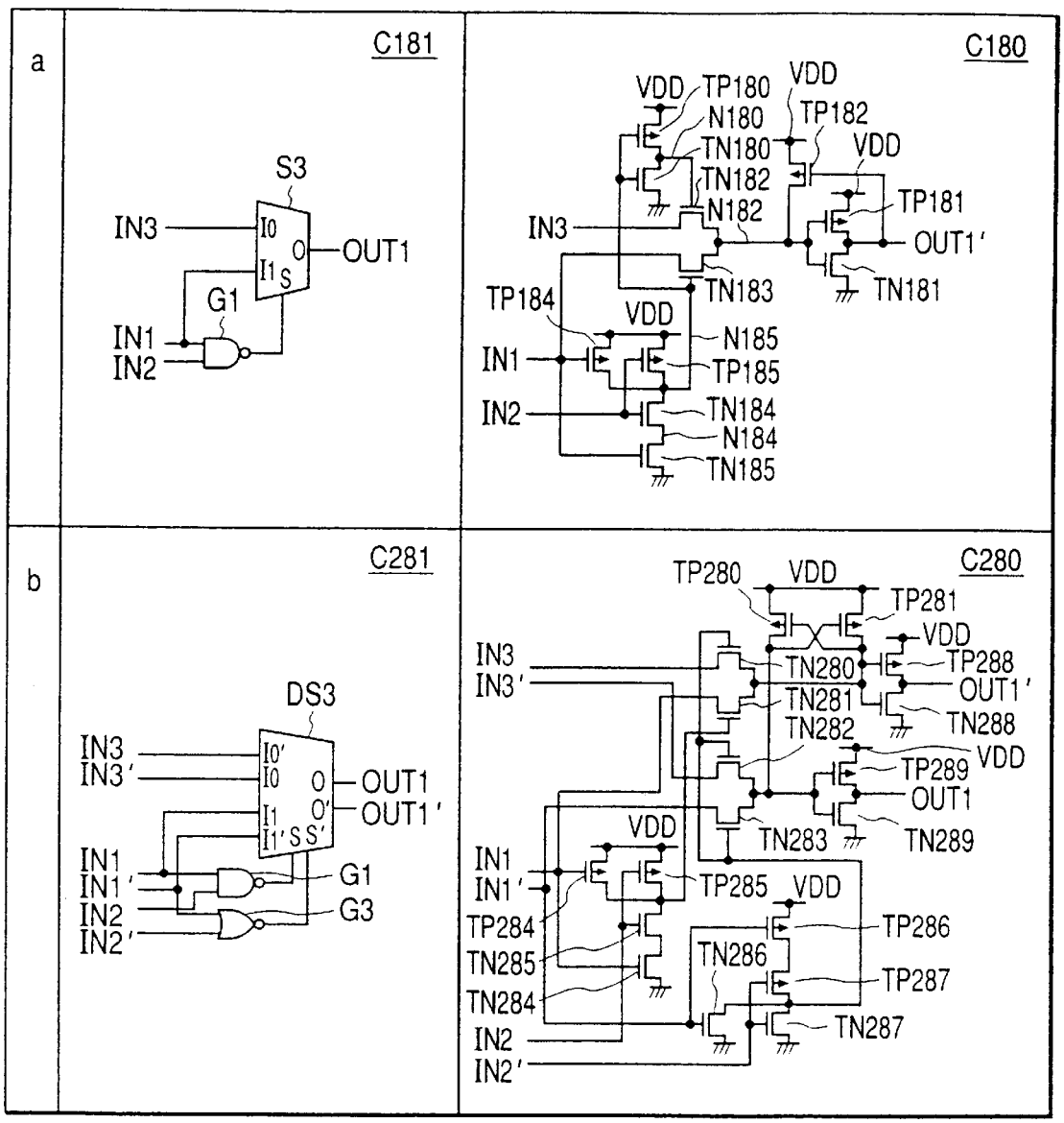
FIG. 12 shows circuit diagrams of the logic circuits C2 and C3 of the present invention shown in the a-row in FIG. 10, from each of which redundant selectors are removed when the input signals IN5 and IN4 are fixed at GND and VDD respectively.

If the circuit C181 is composed of a C100 type selector shown in FIG. 3, the circuit C181 is converted to C180 shown in FIG. 12. The circuit C180 is composed of transistors TN180 to TN185, as well as TP180 to TP185. And, if this circuit C181 is replaced with a differential circuit, the circuit C181 will function like the circuit C281 shown in the b-row in FIG. 12. This circuit could be represented as a transistor circuit C280 shown in FIG. 12.

In the first embodiment, the path of IN3→S5→N5→S6→OUT1 is assumed to be a critical path in the circuit C0 shown in FIG. 1. In this embodiment (まだ実施例1 では?), however, the path of IN4→S5→N5→S6→OUT1 is assumed to be a critical path that decides the delay time of the entire circuit (C10 in FIG. 1). In other words, although two selectors are connected serially in two stages in the circuit and the input I1 is a critical path in each of the selectors S5 in the preceding stage and the selector S6 in the following stage in the first embodiment, the critical path is the input I0 in the selector S5 in the preceding stage and the input I1 in the selector S6 in the following stage in this embodiment. Even in such a case, the delay time can be reduced if the logical circuit of the present invention shown as C1 in FIG. 1 is used as described below.

Figure 13:
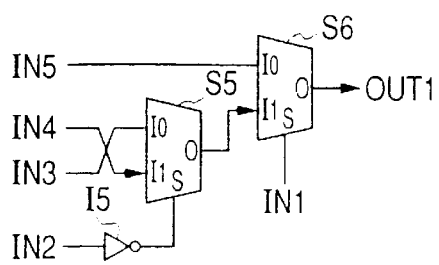
FIG. 13 shows a circuit diagram of the logic circuit C0 shown in the b-row in FIG. 1, in which the control input S of the selector S5 is connected to an inverted signal of the input signal IN2.

This circuit C10 is equivalent logically to the circuit shown in FIG. 13 (in which the signal of the control input S of the selector S5 is inverted) if in accordance with the conversion rules shown in the a-row in FIG. 8. In this circuit shown in FIG. 13, reducing the number of steps in the path of IN4→S5→N5→S6→OUT1 is the same as reducing the number of steps in the path of IN3→S5→N5→S6→OUT1 in the circuit C0 shown in FIG. 1 in the first embodiment. Consequently, if in accordance with the circuit conversion from C0 to C1 in the first embodiment, the circuit C10 can be converted to the circuit C11, which has the same logic function as that of the circuit C10. And, the number of steps in the path between IN4 and OUT1 can be reduced up to only one. If the logic circuit of the present invention is used as described above, therefore, the delay circuit of the circuit can be minimized. In addition, since the selector S11 in this circuit C11 is equivalent to the selector S300 shown in the a-row in FIG. 6, the selector S11 can be replaced with a NAND gate just like in the first embodiment. In this case, the selector S11 functions like the circuit C12 shown in FIG. 10. This circuit C12 can also be converted to a faster one if it is replaced with a differential circuit (C13 shown in FIG. 10) just lie in the first embodiment. Especially, if the circuit C13 shown in FIG. 10 is replaced with a differential circuit, the inverter is omissible, although the inverter had to be inserted in the circuit C12 to invert the signal IN2. The circuit operation can thus be speeded up by the delay time of the inverter.

Figure 5:
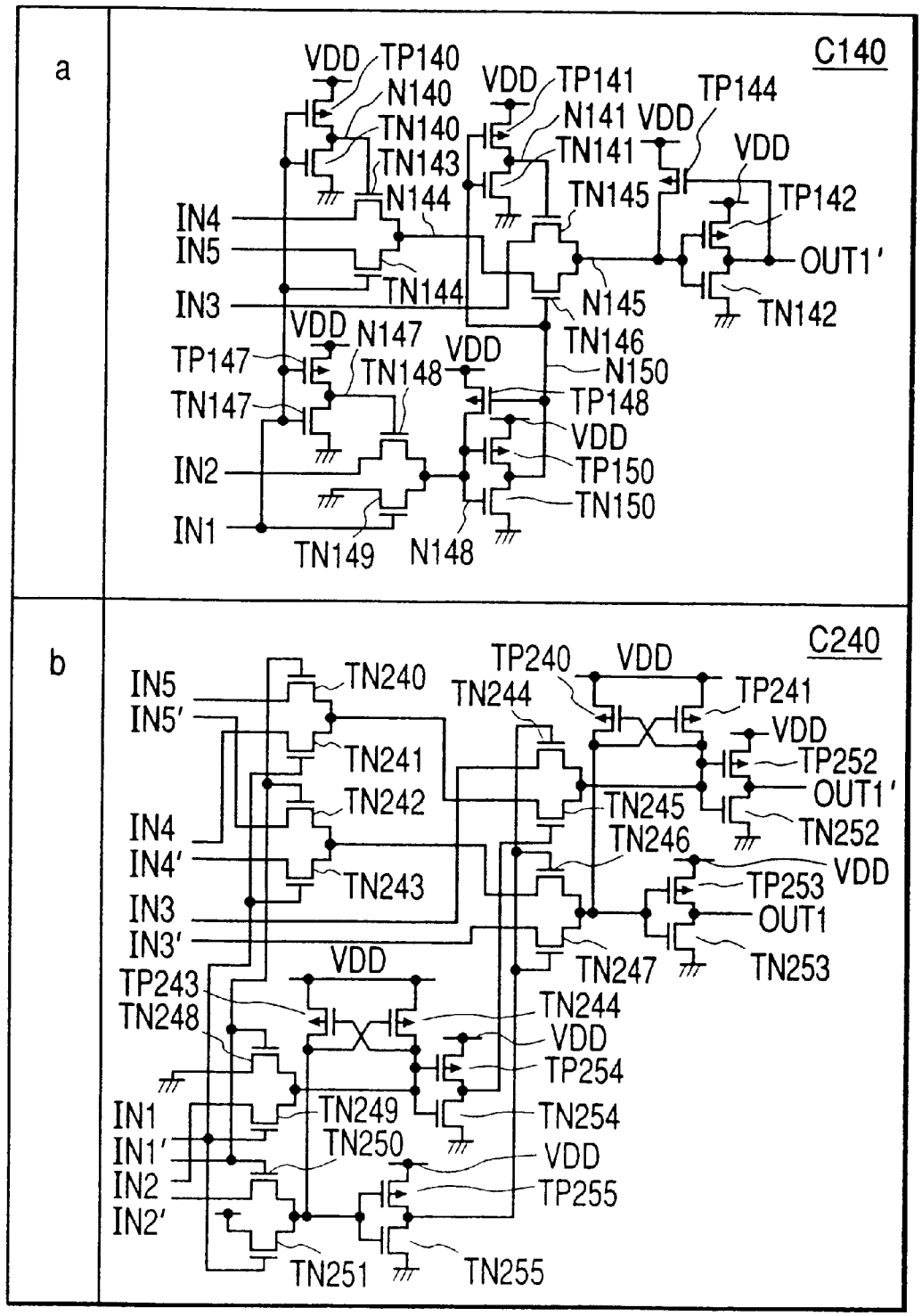
FIG. 5 shows another embodiment of the present invention.

Next, description will be made for a case that the input I0 in the preceding stage selector (S25) and the input I0 in the following stage selector (S26) are object paths (IN3→S25→N25→S26→OUT1) whose delay time should be reduced respectively just like in the circuit C20 shown in the c-row in FIG. 1. Even in this case, the logic circuit of the present invention in the first embodiment can apply to the circuit C20 if the control input IN1 of the selector S26 is inverted. It is also possible to convert the circuit C20 to the circuit C21 shown in the c-row in FIG. 1. And, if the circuit C21 of the present invention, wherein the number of steps in the path between IN3 and OUT1 is less, is used, then the delay time of the circuit C21 will further be reduced. If this circuit C21 is represented as a transistor circuit composed of a selector shown as C100 in FIG. 3, the circuit will be as shown in FIG. 5 (C140 in the a-row). The circuit C140 in FIG. 5 is composed of transistors TN140 to TN150, as well as TP140 to TP150. And, if the circuit C21 is composed of a differential selector shown as C200 in FIG. 3, the circuit will be converted to C240 shown in the b-row in FIG. 5. The circuit C240 is composed of transistors TN240 to TN254, as well as TP240 to TP254. Since the selector S21 in this circuit C21 is equivalent to the selector C320 shown in the c-row in FIG. 6, it is possible to replace the selector S21 with a CMOS gate (C22 shown in the c-row in FIG. 10). And, the selector S21 can be replaced with a differential circuit (C23 shown in the c-row in FIG. 10) to reduce the delay time further.

Next, description will be made for a case that the input I0 is an object path (IN4→S25→N25→S26→OUT1) whose delay time should reduced in the selectors (S25) and (S26) in both preceding and following stages just like in the circuit C30 shown in the d-row in FIG. 1. Even in this case, the IN2 can be inverted in the circuit C20 to convert the circuit C20 to C31 shown in the d-row in FIG. 1. And, it is possible to reduce the number of steps in the path between IN4 and OUT1 up to only one step (selector) just like in the above case. Also in this circuit C31, the selector S31 is equivalent to the selector S320 shown in the c-row in FIG. 6. The selector S31 can thus be replaced with a CMOS gate (C32 in the d-row in FIG. 10). In addition, the selector S31 can be replaced with a differential circuit (C33 in the d-row in FIG. 10) to reduce the delay time further.

And, if the input I0 or I1 of the preceding or following stage selector is an object path whose delay time should be reduced in a circuit including two selectors connected serially (a- to d-rows in FIG. 1) in two stages, using the logic circuits (C1, C11, C21, and C31) of the present invention will be effective to reduce the number of steps in the critical path, as well as the delay time of the circuit.

<Second Embodiment>

In this second embodiment, the control input S in the preceding stage selector (S45) and the input I1 in the following stage selector (S46) are the object paths (IN2→S45→N45→S46→OUT1) whose delay time should be reduced respectively as shown in the circuit C40 in the a-row in FIG. 2. In this case, if the logic circuit C41 shown in FIG. 2 of the present invention, which has the same logical function as that of the circuit C40, is used, it is possible to reduce the number of steps in the path between IN2 and OUT1 up to one step composed of only the selector S43, as well as reduce the delay time of the entire circuit. The circuits C40 and C41 have the same logical function, since the Boolean expressions of those circuits are the same in pattern as shown below. The Boolean expression of the circuit C40 is as shown below.

$$OUT\ 1 = IN1 \cdot N45 + IN1' \cdot IN5 \quad (E40)$$

$$= IN1F(IN2 \cdot IN3 + IN2' \cdot IN4) + IN1' \cdot IN5$$

If this expression (E40) is converted in accordance with the formula of Shannon expansion (e.g., refer to IEEE TRANSACTIONS ON COMPUTERS, Vol.C-27, No.6. pp.509–516. Hereafter, to be abbreviated as document 8) with respect to IN2, the result will be as shown below.

$$OUT\ 1 = IN2 \cdot \{IN2 = \text{``1''} \text{ in expression } (E40)\} + IN2' \cdot \quad (1)$$

$$\{IN2 = \text{``0''} \text{ in expression } (E40)\}$$

$$= IN2 \cdot \{IN1 \cdot (1 \cdot IN3 + 0 \cdot IN4) + IN1' \cdot IN5\} + IN2' \cdot$$

$$\{IN1 \cdot (0 \cdot IN3 + 1 \cdot IN4) + IN1' \cdot IN5\}$$

$$= IN2 \cdot (IN1 \cdot IN3 + IN1' \cdot IN5) + IN2' \cdot$$

$$(IN1 \cdot IN4 + IN1' \cdot IN5)$$

$$= IN2 \cdot N41 + IN2' \cdot N42$$

This expression matches with the Boolean expression represented for the circuit C41. If the path between IN2 and OUT1 is a critical path in the circuit C40 and the circuit C40 is replaced with the circuit C41 of the present invention, therefore, using completely the same logic function as that of the C40 makes it possible to reduce the number of steps in the critical path, as well as reduce the delay time of the entire circuit.

Next, description will be made for a case that the input I0 of the following stage selector (S46) is a critical path (IN2→S55→N55→S56→OUT1) shown as C50 in the b-row in FIG. 2. In this case, the IN1 in the circuit C40 is regarded to be inverted, so it is possible to reduce the number of steps in the path using the circuit C51 shown in the b-row in FIG. 2. The logic circuit of the present invention can be used such way to reduce the delay time of the circuit in this case.

Also in any of the circuits (C41 and C51) in this embodiment, if there are selectors equivalent to the selectors S300 to S330 shown in the a- to d-rows in FIG. 6, those selectors can be replaced with CMOS gates to compose an object circuit. And, each of those selectors can be replaced with a differential circuit to reduce the delay time further.

As described above, if the control input S in the preceding stage selector and the input I0 or I1 in the following stage selector are the object paths whose delay time should be reduced respectively in a circuit including two selectors connected serially in two stages, using the logic circuits (C41 and C51) of the present invention will be effective to reduce the number of steps in the critical path, as well as reduce the delay time of the entire circuit.

<Third Embodiment>

Figure 2:
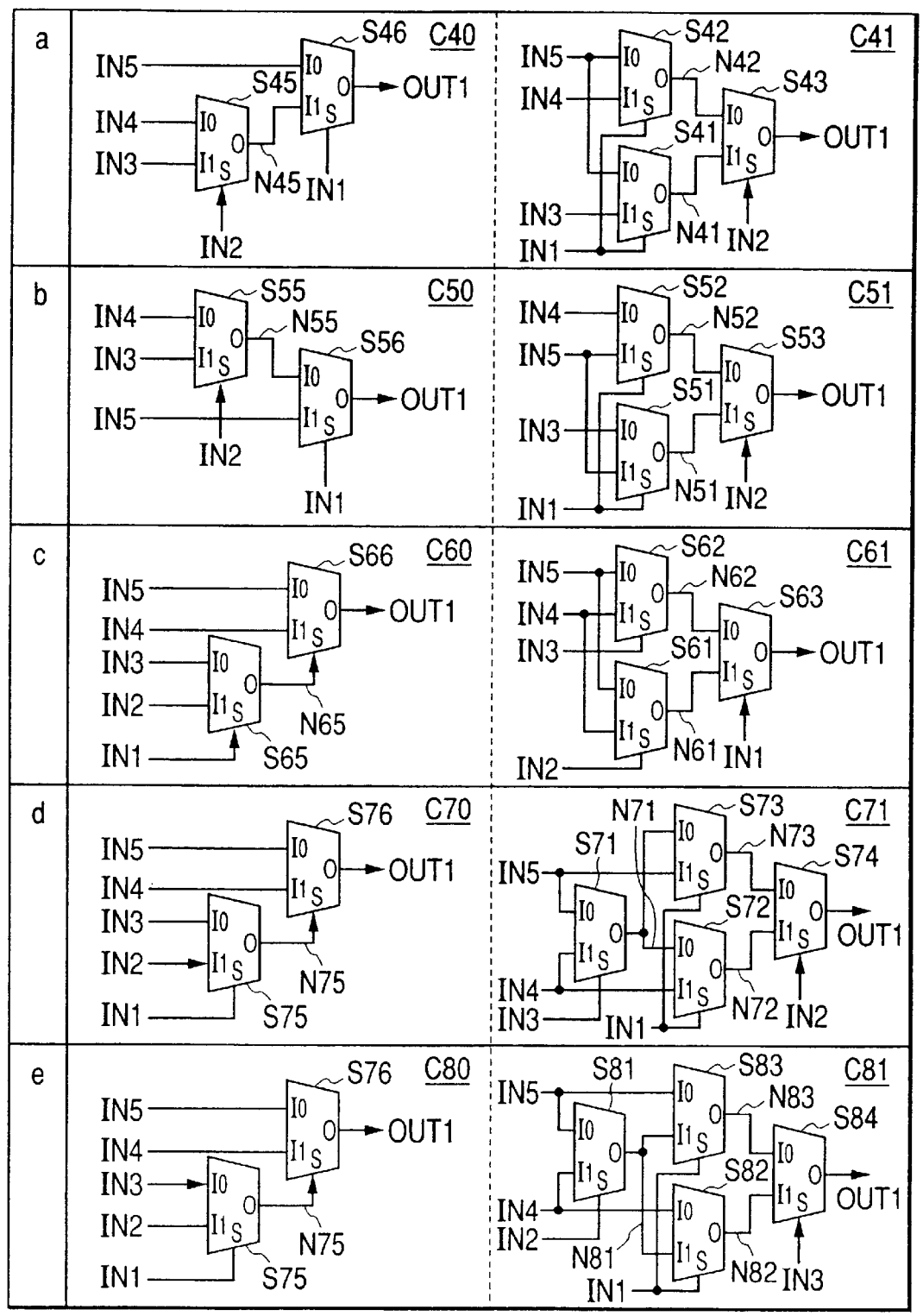
FIG. 2 shows another embodiment of the present invention.

Unlike the first and second embodiments, the control input S of both preceding and following stage selectors (S65) and (S66) is an object path whose delay time should be reduced (IN1→S65→N65→S66→OUT1) in the circuit C60 shown in the c-row in FIG. 2 in this third embodiment. In this embodiment, using the logic circuit of the present invention, shown as C61 in FIG. 2 and having the same logic function as that of the circuit C60, will be effective to reduce the number of steps in the object path up to only one step (IN1→S63→OUT1). Consequently, it is also possible to reduce the delay time of the entire circuit. The circuits C60 and C61 are equivalent to each other logically just like in the second embodiment. This can be proved as shown below through the use of the Shannon expansion introduced in the document 8. The Boolean expression of the circuit C60 will be as shown below.

OUT1=N65·IN4+N65'·IN5=(IN1·IN2+IN1'·IN3)·IN4+(IN1·IN2+ IN1'·IN3)'·IN5     (E60)

Shannon expansion is then applied to the expression (E60) as follows with respect to IN1.

$$OUT1 = IN1 \cdot \{IN1 = \text{"1" in expression } (E60)\} + IN1' \cdot$$

$$\{IN1 = \text{"0" in expression } (E60)\}$$

$$= IN1 \cdot \{(1 \cdot IN2 + 0 \cdot IN3) \cdot IN4 + (1 \cdot IN2 + 0 \cdot IN3)' \cdot IN5\} +$$

$$IN1' \cdot \{(0 \cdot IN2 + 1 \cdot IN3) \cdot IN4 + (0 \cdot IN2 + 1 \cdot IN3)' \cdot IN5\}$$

$$= IN1 \cdot (IN2 \cdot IN4 + IN2' \cdot IN5) + IN1' \cdot (IN3 \cdot IN4 + IN3' \cdot IN5)$$

$$= IN1 \cdot N61 + IN1' \cdot N62$$

This expression matches with the Boolean expression represented for the circuit C61.

As described above, the logic circuit (C61) of the present invention can also be used to reduce the number of steps in the object path, as well as the delay time of the entire circuit even when the control input S is the object path whose delay time should be reduced in the selectors in both preceding and following stages in a circuit including two selectors connected serially in two stages.

(Fourth Embodiment)

Unlike the first to third embodiments, the input I1 in the preceding stage selector (S75) and the control input S in the following stage selector (S76) are the object paths (IN2→S75→N75→S76→OUT1) whose delay time should be reduced respectively in this fourth embodiment. The path is shown as C70 in the d-row in FIG. 2.

In this embodiment, the logic circuit of the present invention, which is shown as C71 in the c-row in FIG. 2, is effective. When compared with the original circuit C70, this circuit C71 of the present invention can reduce the number of steps more in the object path between IN2 and OUT1; from two to one. As for other paths, however, the number of steps in the path between IN4 and OUT1 increases from one to three. Even for a case that the input signal IN2 is delayed far more than other input signals, it is still possible to reduce the delay time of the entire circuit. This is because the number of steps between IN2 and OUT1 is reduced significantly.

The circuits C70 and C71 are the same logically just like in the second and third embodiments. This can be proved as shown below through the use of Shannon expansion. The Boolean expression of the circuit C70 will as be shown below.

$$OUT1 = N75 \cdot IN4 + N75' \cdot IN5 \quad\quad\quad (E70)$$

$$= (IN1 \cdot IN2 + IN1' \cdot IN3) \cdot IN4 +$$

$$(IN1 \cdot IN2 + IN1' \cdot IN3)' \cdot IN5$$

Then, Shannon expansion is applied to the expression (E70) as follows with respect to IN2.

$$OUT1 = IN2 \cdot \{IN2 = \text{"1" in expression } (E70)\} + IN2' \cdot \{IN1 = \text{"0" in expression } (E70)\}$$

$$= IN2 \cdot \{(IN1 \cdot 1 + IN1' \cdot IN3) \cdot IN4 + (IN1 \cdot 1 + IN1' \cdot IN3)' \cdot IN5\} +$$

$$IN2' \cdot \{(IN1 \cdot 0 + IN1' \cdot IN3) \cdot IN4 + (IN1 \cdot 0 + IN1' \cdot IN3)' \cdot IN5\}$$

$$= IN2 \cdot \{IN1 \cdot IN4 + IN1' \cdot (IN3 \cdot IN4 + IN3' \cdot IN5)\} +$$

$$IN2' \cdot \{IN1 \cdot IN5 + IN1' \cdot (IN3 \cdot IN4 + IN3' \cdot IN5)\}$$

$$= IN2 \cdot (IN1 \cdot IN4 + IN1' \cdot N71) + IN2' \cdot (IN1 \cdot IN5 + IN1' \cdot N71)$$

$$= IN2 \cdot N72 + IN2' \cdot N73$$

This expression matches with the Boolean expression represented for the circuit C71.

Next, description will be made for a case that the input I0 in the preceding stage selector (S75) is the object path (IN3→S75→S76→OUT1) whose delay time should be reduced unlike the circuit C70. The path is shown as C80 in the e-row in FIG. 2. In this case, the IN1 in the circuit C70 is inverted. It is thus possible to replace the circuit C80 with the circuit C81 shown in the e-row in FIG. 2 thereby to reduce the number of steps in the object path up to one step (IN3→OUT1). Such way, using the logical circuit of the present invention makes it possible to reduce the number of steps in the critical path, as well as the delay time of the entire circuit in this embodiment.

Even if the input I1 or I0 in the preceding stage selector is a critical path and the control input S is a critical path in the following stage selector in a circuit including two selectors connected serially in two stages, using the logic circuits (C71 and C81) of the present invention will make it possible to reduce the number of steps in such critical paths and the delay time of the entire circuit.

<Fifth Embodiment>

Figure 14:
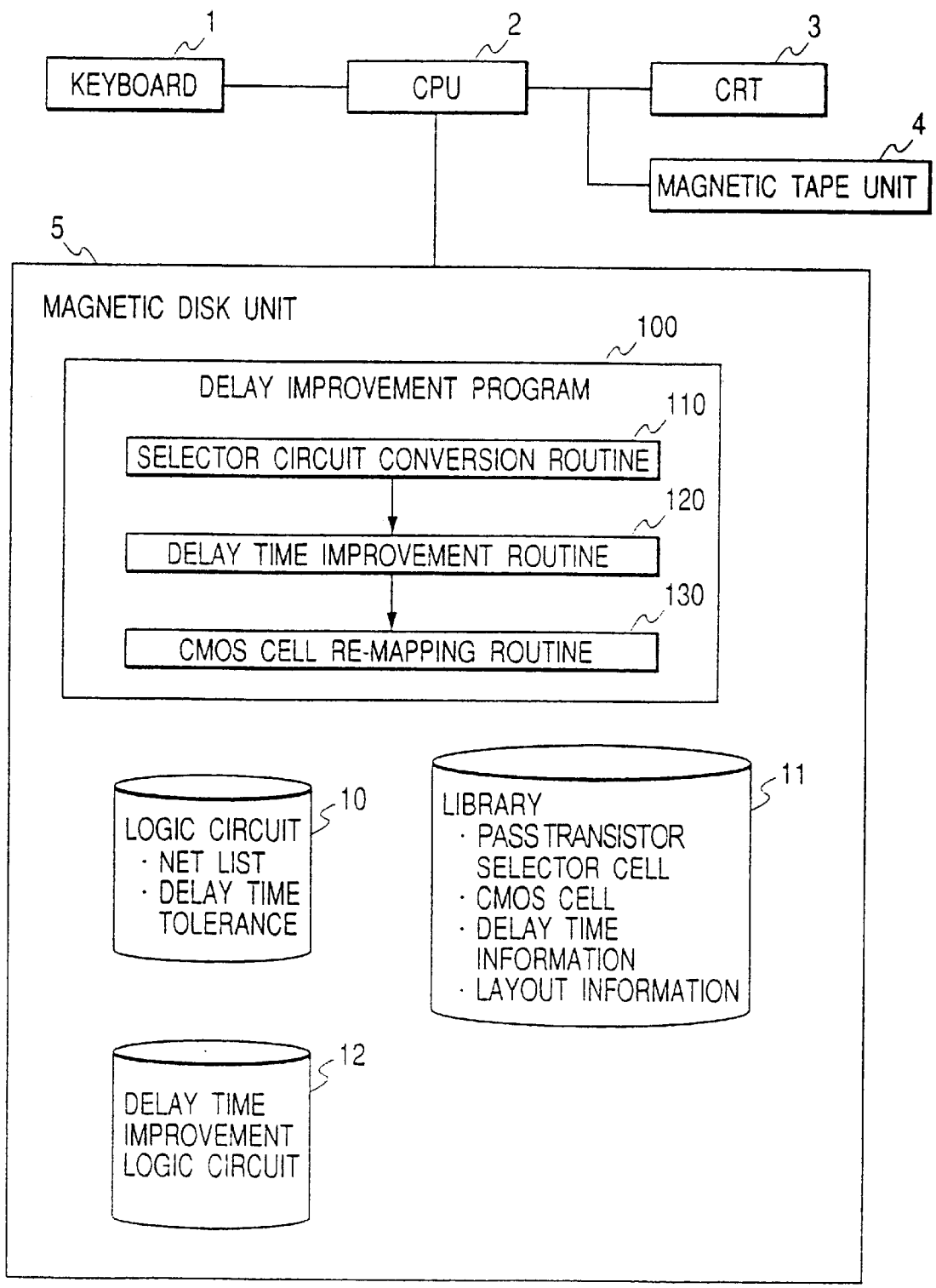
FIG. 14 shows the outline of a delay time improvement program, which uses selectors, and a computer system used to execute the delay time improvement program in the fifth embodiment of the present invention.

In the first to fourth embodiments described above, description was made for a simple logic circuit with respect to how to reduce the number of steps in a critical path, as well as reduce the delay time in a circuit in which two selectors are connected serially in two stages using logic circuits (C1, C11, C21, C31, C41, C51, C61, C71, and C81). In other words, this means that if a circuit is composed only of selectors, it is possible to reduce the number of steps in a critical path and the delay time of the entire circuit by dividing the circuit into 2-stage selectors and replacing each of those selectors with a logical circuit of the present invention regardless of the path, which is assumed to be a critical path. In addition, even a CMOS logic circuit can be converted to a logic circuit with less delay time if it is replaced with a selector circuit, which is equivalent to the CMOS logic circuit logically, then replaced with a logic circuit of the present invention in units of selector circuits in two stages. Hereunder, description will be made for how to reduce a delay time of a more complicated logic circuit using the logic circuits of the present invention and a computer system shown in FIG. 14.

(1) Overall Configuration of the Computer System

Figure 15:
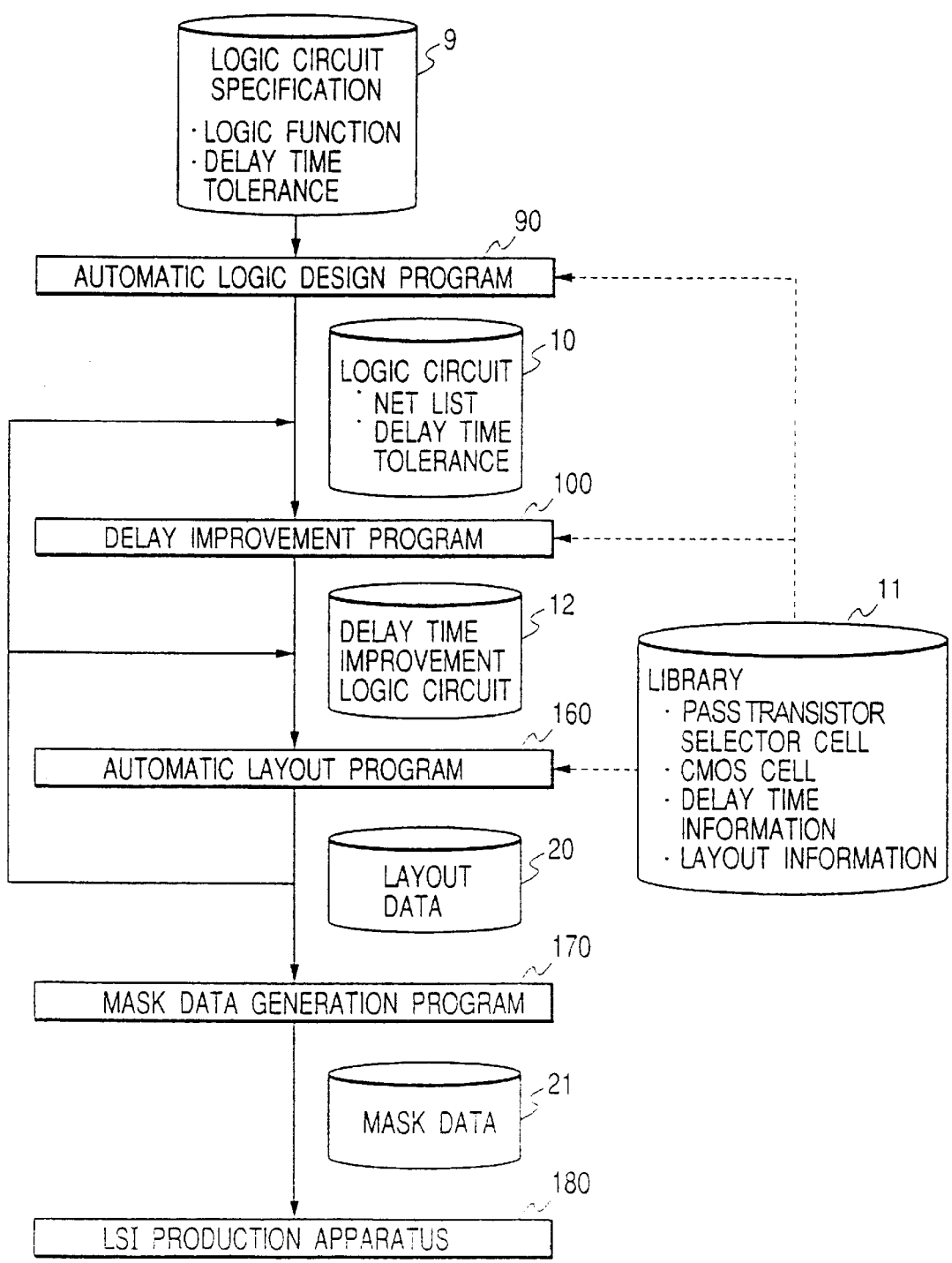
FIG. 15 is a flowchart indicating processes for producing an LSI circuit started at a logic circuit specification using the delay time improvement program, which uses the logic circuits of the present invention.

FIG. 15 shows a schematic structure of a delay time improvement program 100, which uses the logic circuits of the present invention and a computer system used to execute the delay time improvement program. This computer system comprises an input unit such as a keyboard 1, a central processing unit (CPU) 2, a display unit (CRT) 3, a magnetic tape unit 4, and a magnetic disk unit 5 used to store the delay time improvement program 100, which uses selectors. The program 100 includes a selector circuit conversion routine 110, a delay time improvement routine 120, and a CMOS cell re-mapping routine 130. This program 100 is loaded into the CPU 2 from the magnetic disk unit and executed when a designer enters an instruction from the keyboard 1. How much a delay time is reduced is displayed on the CRT 3 and a generated delay time improvement logic circuit is passed to an automatic layout program 160 shown in FIG. 15 via the magnetic tape unit 4, etc.

In FIG. 15, the designer enters logic circuit specifications 9. These logic circuit specifications 9 include logic functions respective logic circuits, as well as such information as delay time tolerance, etc. for delay times of input and output signals of the respective logic circuits. An automatic logic circuit design program 90 generates a logic circuit 10 from the logic circuit specifications 9 with reference to a library 11. The logic circuit 10 contains a net list describing relationships of wiring among cells and the delay time tolerance information described above. The delay time improvement program 100, which uses selectors specific to this embodiment, outputs the delay time improvement logic circuit 12 provided with the same logic function as that of the logic circuit 10 with reference to the library 11 according to the information described in the logic circuit 10 so as to satisfy an object delay time tolerance. An automatic layout program 160 decides a layout optimized to this logic circuit with reference to the library 11 and creates layout data 20. A mask data generation program 170 decides a plurality of mask patterns used to generate the logic circuit designed above using LSI circuit technologies thereby generating mask data 21 representing those mask patterns. An LSI production apparatus 180 produces LSI circuits provided with object logic functions respectively using the mask data 21. Each of the programs 90, 100, 160, and 170 is executed on a computer assigned only to itself; one computer is assigned only to one program. Of course, those programs can also be executed in the same computer. Each of the automatic logic circuit design program, the automatic layout program, and the mask data generation program can be created using existing tools.

This embodiment is characterized as follows; In order to reduce a delay time of a logic circuit, an entered logic circuit is replaced with a selector circuit equivalent to the entered logic circuit logically, then the circuit in a critical path is replaced with a logic circuit of the present invention in units of selectors in two stages. Hereunder, description will be made for each routine executed in this embodiment using the logic circuit shown in FIG. 18 as an example. In the logic circuit shown in this FIG. 18, the delay time of each of the input signals A to H is premised to be 0 ns (=no delay) and the tolerance of each output signal OUT is premised to be 0 ns. This means that an output signal must be output within the minimum delay time in this case.

(2) Selector Circuit Conversion Routine 110

This routine 110 generates a logic circuit composed of selector circuits from the logic circuit 10 so that the generated logic circuit is provided only with the same logic function as that of the logic circuit 10 according to the conversion pattern shown in FIG. 6. For example, in the case of the logic circuit shown in FIG. 18, the conversion pattern shown in the a-row in FIG. 6 is applicable for the 2-input AND gates G500, G502, G504, and G506 and the conversion pattern shown in the b-row in FIG. 6 is applicable for the rest 2-input OR gates G501, G503, and G505. The circuit is thus converted to a logic circuit composed only of the selectors shown in FIG. 1.

(3) Delay Time Improvement Routine 120

This routine re-maps logic circuits generated with the selector circuit conversion routine 110 in (2) partially in order using the logic circuits of the present invention described in the first to fourth embodiments thereby converting a given logic circuit so as to satisfy an object delay time tolerance.

At first, description will be made for both forward and reverse delay times with reference to the simplified circuit shown in FIG. 17, since the routine calculates the delay time of each given logic circuit. In addition, it is premised to simplify the description that the delay time of a path between two input terminals and an output terminal in each of the AND gates G400, G401, and G402 shown in FIG. 17 is 1 ns.

Figure 17:
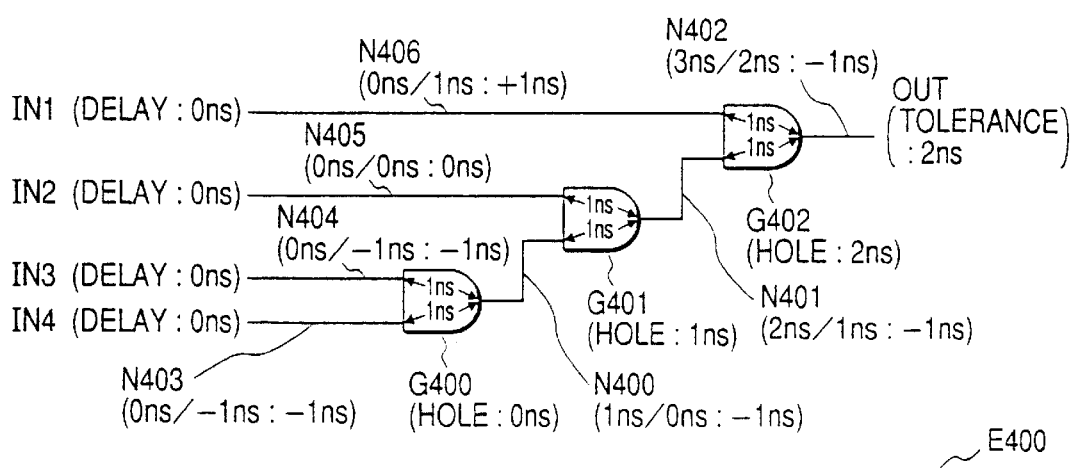
FIG. 17 illustrates a forward delay time, a reverse delay time, a slack and a hole in the fifth embodiment of the present invention.

A forward delay time is defined as a value obtained by adding the delay time of an input signal to the delay time of each cell existing on an object path as shown in the expression 1 of E400 shown in FIG. 17. In other words, a delay time corresponds to a time required until a signal is transmitted to the node. For example, at the node N400 in the circuit shown in FIG. 17, a value obtained by adding the delay time (0 ns) of both input signals IN3 and IN4 to the delay time (1 ns) of the cell G400=1 ns is defined as the time required for transmitting the signal to the node. The forward delay time thus becomes 1 ns. As for the node N401, the forward delay time of this node is defined to be 2 ns, since the delay time is assumed to be the time (2 ns) obtained by adding the delay time (1 ns) of the cell G401 to the forward delay time (1 ns) of the node N400 or the time (1 ns) obtained by adding the delay time (1 ns) of the cell G401 to the forward delay time (0 ns) of the node N405, whichever is later.

On the other hand, a reverse delay time is defined as a value obtained by subtracting the delay time of each cell existing on an object path sequentially from the tolerance of output signals as shown in the expression 2 of E400 in FIG. 17. In other words, a reverse delay time corresponds to the delay time required at each node, since each output signal is determined within a predetermined delay time tolerance. For example, in order to determine an output signal OUT at a delay time tolerance of 2 ns in the circuit shown in FIG. 17, the signal must be transmitted to the node N401 within a delay time of 1 ns, which is faster than that by the delay time (1 ns) of the cell G402. The reverse delay time of the node N401 thus becomes 1 ns. As for the node N400, the object signal must be determined more faster by the reverse delay time (1 ns) of the node N401. The reverse delay time of this node thus becomes 0 ns.

After both forward and reverse delay times are calculated such way in the process 121, a slack is calculated from those values in the next process 122. A slack is defined by a value obtained by subtracting a forward delay time from a reverse delay time as shown in the expression 3 of E400 in FIG. 17. If a slack of each node is calculated in this circuit shown in FIG. 17, the results will be as shown below.

$N400$: 0 ns–1 ns=–1 ns $N401$: 1 ns–2 ns=–1 ns $N402$: 2 ns–3 ns=–1 ns $N403$: –1 ns–0 ns=–1 ns $N404$: –1 ns–0 ns=–1 ns $N405$: 0 ns–0 ns=0 ns $N406$: 1 ns–0 ns=+1 ns

A reverse delay time corresponds to a delay time of an output signal at a node, which is needed for determining the output signal just at a predetermined delay time tolerance. A forward delay time corresponds to a time required until a signal is transmitted to the node. In other words, if the slack of a node is a positive value, an object signal is transmitted at a delay time actually smaller than a delay time required to satisfy a predetermined tolerance. Consequently, if a slack has a positive value, it means that an object signal may arrive at an object node more later. On the contrary, if a slack has a negative value, it means that an object circuit cannot operate at a predetermined delay time tolerance unless the delay time of the path to the node is reduced. This is because the signal is actually transmitted later than the relay time required to satisfy a predetermined tolerance. If a slack is defined by a difference between reverse and forward delay times such way thereby calculating the slack at every node of an object circuit, it is possible to know at a glance which part functions as an obstacle for the entire circuit to make a fast operation. Consequently, it is also possible to know how to re-map the part for minimizing the delay time of the entire circuit. In this circuit shown in FIG. 17, for example, the critical path is N403→G400→N400→G401→N401→G402→N402 whose slack is –1 ns. And the critical path decides the delay time of this entire circuit. The delay time of this entire circuit will thus not be reduced unless the delay time of this path is reduced. This makes no sense for a simple circuit as shown in FIG. 17, but makes sense significantly for a complicated logic circuit designed with the automatic logic circuit design tool, etc., which would be out of one's control.

Next, the hole of each cell is calculated from the slack of each node calculated in the process 123. A cell hole is defined by the minimum difference value of the slacks found from among input terminals with respect to the nodes to which the input terminals are connected as shown in the expression of E400 in FIG. 17. Since a slack corresponds to a delay time allowance of each node as described above, a cell, when having a large hole value, means that the delay time of only one of a plurality of input terminals is far larger than those of other input terminals. In other words, if it is possible to reduce the delay time of a signal from the only one slow input terminal while the delay times of signals from other input terminals are sacrificed, it is possible to reduce the delay time of the entire circuit. The delay time of the entire circuit will not be increased in this case, since the delay times of signals from other input terminals still have a time to spare respectively. As described in the first to fourth embodiments, the use of the logic circuits of the present invention makes it possible to re-map each circuit thereby to reduce the number of steps in each critical path and the delay time of an entire circuit without fail. In this case, however, the number of steps and the delay time may be increased in other paths sometimes. And, this problem can be avoided, as described above; since there is only a path whose delay time is far larger than those of other paths in a cell whose hole value is large, if it is possible to reduce the delay time of the one path, the delay time of the entire circuit can be reduced surely. The delay times of other paths are increased a little in this case, however. This means that the delay time of the entire circuit can be reduced if a cell having a large hole is found and the cell is re-mapped using a logic circuit of the present invention.

The holes of each cell in the circuit shown in FIG. 17 are calculated as follows:

$G400$: 0 ns (difference of slack between $N403$ and $N404$)

$G401$: 1 ns (difference of slack between $N400$ and $N405$)

$G402$: 2 ns (difference of slack between $N401$ and $N406$)

In other words, each of the cells G402 and G401 has holes in this circuit shown in FIG. 17. And, if the circuit composed of those G402 and G401 is re-mapd properly, it is possible to convert the circuit to a faster one.

Figure 18:
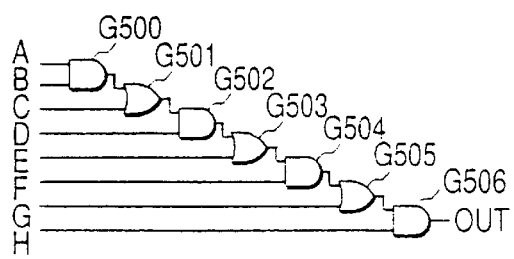
FIG. 18 is an example of a logic circuit to be entered to the delay time improvement program, which uses the logic circuit of the present invention shown in FIG. 16.
Figure 19:
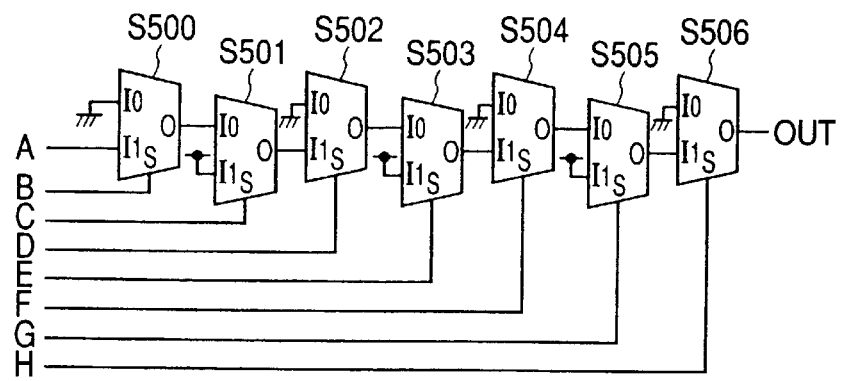
FIG. 19 is a circuit diagram of a logic circuit composed of only selectors generated with a selector circuit conversion routine of the delay time improvement program, which uses the logic circuit of the present invention shown in FIG. 16.

Although a simple circuit shown in FIG. 17 is used to describe slacks and holes in the above case, the same will also go for the circuit shown in FIG. 19, which is obtained by converting the selectors of the circuit shown in FIG. 18 to the present ones. In the circuit shown in FIG. 19, if the delay time of each path between the control input S and the input I0 or I1 and the output O of a selector is 0.2 ns, the delay time of the circuit shown in FIG. 19 becomes 1.4 ns and the critical path is A→S500→S501→S502→S503→S504→S505→506→OUT (7-step selector). Then, the holes of each cell is calculated as follows:

$S500$: 0 ns $S501$: 0.2 ns $S502$: 0.4 ns $S503$: 0.6 ns $S504$: 0.8 ns $S505$: 1.0 ns $S506$: 1.2 ns

Figure 20:
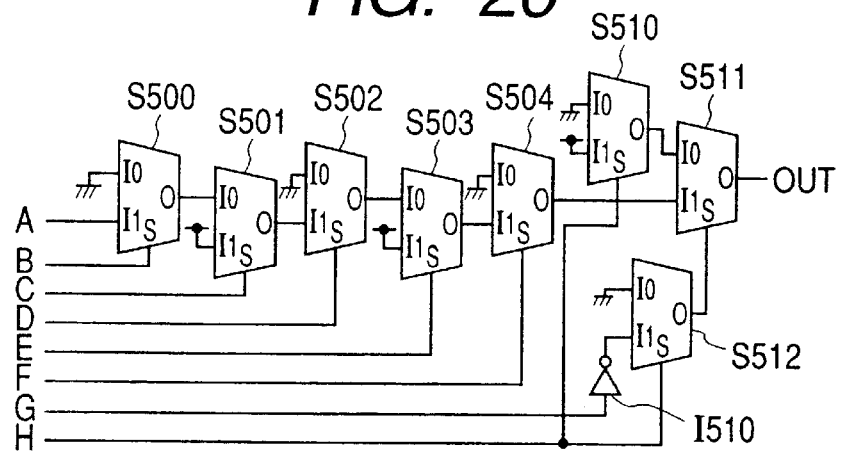
FIG. 20 is a circuit diagram of an intermediate circuit generated in the middle of an execution of the delay time improvement routine of the delay time improvement program, which uses the logic circuit of the present invention shown in FIG. 16.
Figure 21:
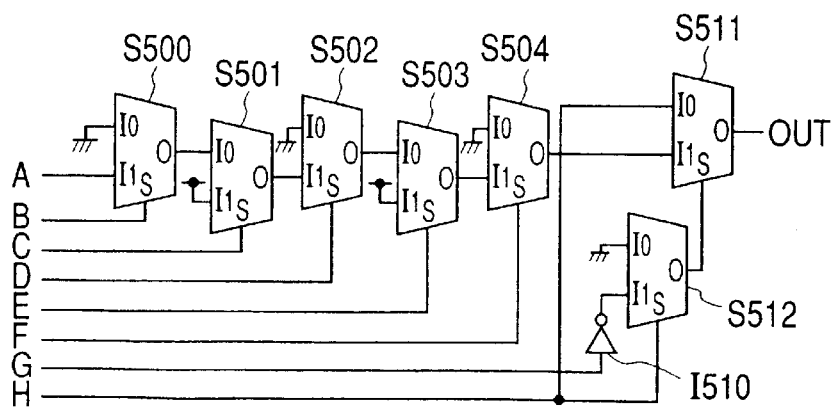
FIG. 21 is a circuit diagram of an intermediate circuit generated at a middle of an execution of the delay time improvement routine of the delay time improvement program, which uses the logic circuit of the present invention shown in FIG. 16.
Figure 22:
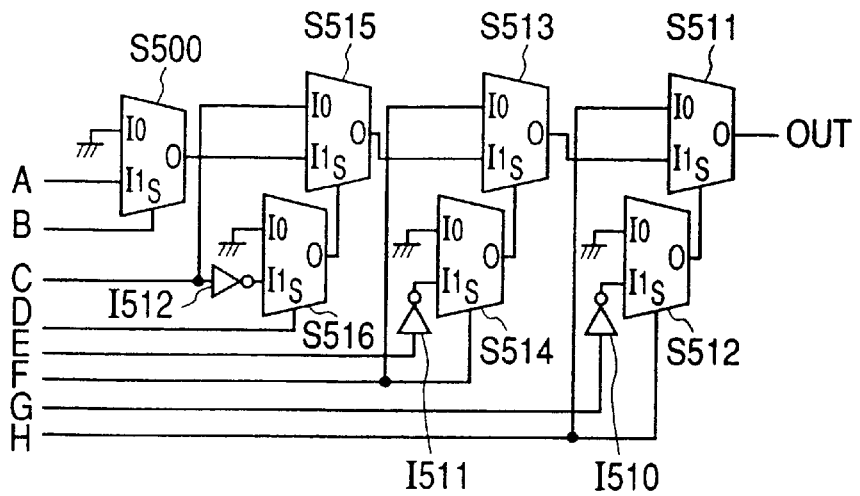
FIG. 22 is a circuit diagram of an intermediate circuit generated at a middle of an execution of the delay time improvement routine of the delay time improvement program, which uses the logic circuit of the present invention shown in FIG. 16.

The holes of each of the cells S505 and S506 are largest as shown above. The part composed of those cells S505 and S506 can be replaced with a logic circuit of the present invention thereby to surely reduce the delay time of the entire circuit. This part is actually equivalent to the circuit C10 shown in the b-row in FIG. 1, wherein the input I0 is a critical path in the preceding stage selector (S505) and the input I1 is a critical path in the following stage selector (S500). The circuit is thus replaced with a logic circuit of the present invention, which is shown as C11 in the b-row in FIG. 11. As a result, the circuit is converted to the one shown in FIG. 20. In the circuit shown in FIG. 20, the selectors S510, S510, and S512 are used instead of the selectors S505 and S506 shown in FIG. 19. Among those selectors, the selector S510 is redundant like the circuit shown in the c-row in FIG. 8. It is thus omissible. The circuit can thus be simplified as shown in FIG. 21. In FIG. 21, the critical path is A→S500→S501→S502→S503→S504→S511→OUT. The number of steps in the path is 6, which is one step less than that of the circuit shown in FIG. 19. The delay time of the critical path is 1.2 ns. This means that the delay time is reduced by 0.2 ns from the delay time of the circuit shown in FIG. 19. This value is equivalent to the delay time of one step in the selector. The cells S503, S504, S501, and S502 having holes respectively in the circuit shown in FIG. 21 can be replaced with the logic circuits of the present invention in the same procedure as the above, thereby to obtain the circuit shown in FIG. 22. In FIG. 22, the critical path is A-S500→S515→S513→S511→OUT. The number of steps in the circuit is reduced up to 4 steps of selectors, which is two steps less than those of the circuit shown in FIG. 21. The delay time of the circuit is reduced up to 0.8 ns, which is 0.4 ns smaller than that of the circuit shown in FIG. 21.

Figure 23:
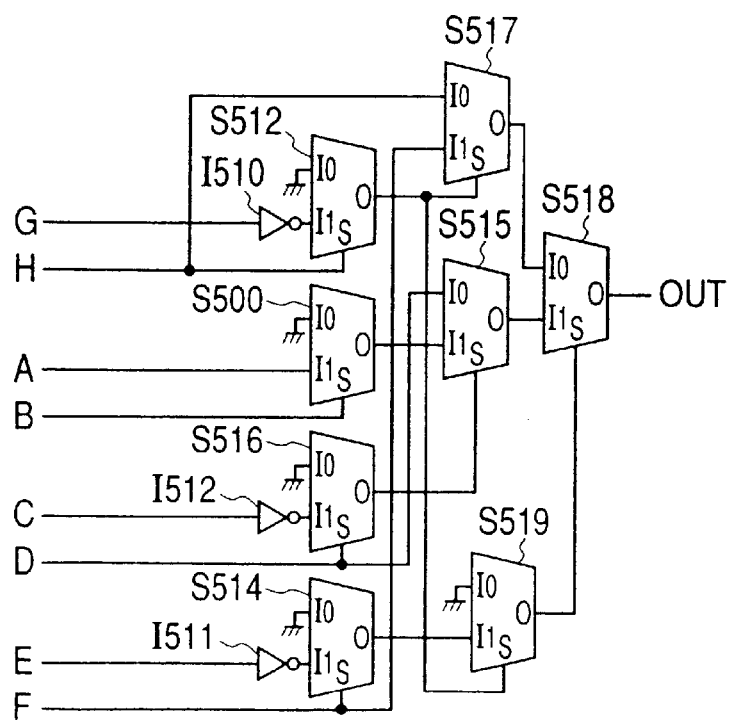
FIG. 23 is a circuit diagram of a circuit output finally by the delay time improvement routine of the delay time improvement program, which uses the logic circuit of the present invention shown in FIG. 16.

In this circuit shown in FIG. 22, the cells S513 and S511 having holes respectively can be re-mapped in the same procedure as the above, thereby to obtain the circuit shown in FIG. 23 finally. In the circuit shown in FIG. 23, the critical path is G→I510→S512→S517→S518→OUT (or C→I512→S516→S515→S518→OUT or E→I511→S519→S516→S515→S518→OUT or E→I511→S514→S519→S518→OUT). The number of steps in this path is reduced up to 4 steps (1 inverter and 3 selectors). If the delay time of the inverter is assumed to be 0.1 ns, the delay time of this circuit shown in FIG. 23 becomes 0.9 ns.

(4) CMOS Cell Re-mapping Routine 130

This routine reduces the delay time of an object circuit significantly by replacing its selectors equivalent to those shown in the a- to d-rows in FIG. 6 with NAND or NOR gates, etc. composed of a CMOS circuit respectively. This routine also reduces the delay time of the circuit significantly by remapping each of those selectors with a differential circuit shown as C200, C201, etc. in the b-row in FIG. 3.

Figure 24:
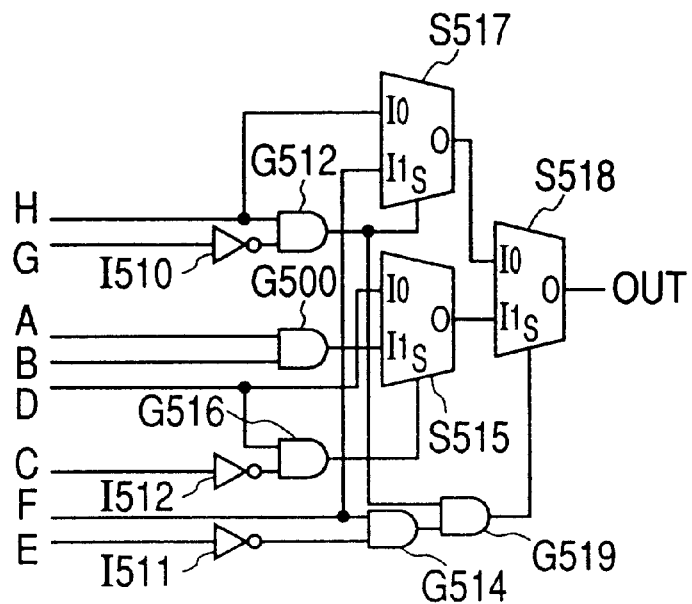
FIG. 24 is a circuit diagram of a circuit generated in the middle of an execution of the CMOS cell re-mapping routine of the delay time improvement program, which uses the logic circuit of the present invention shown in FIG. 16.
Figure 25:
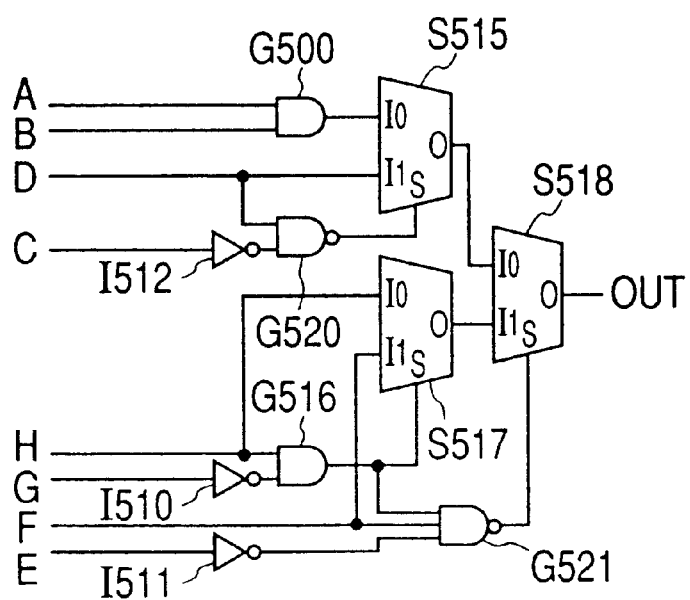
FIG. 25 is a circuit diagram of a circuit output finally by the CMOS cell re-mapping routine of the delay time improvement program, which uses the logic circuit of the present invention shown in FIG. 16.
Figure 26:
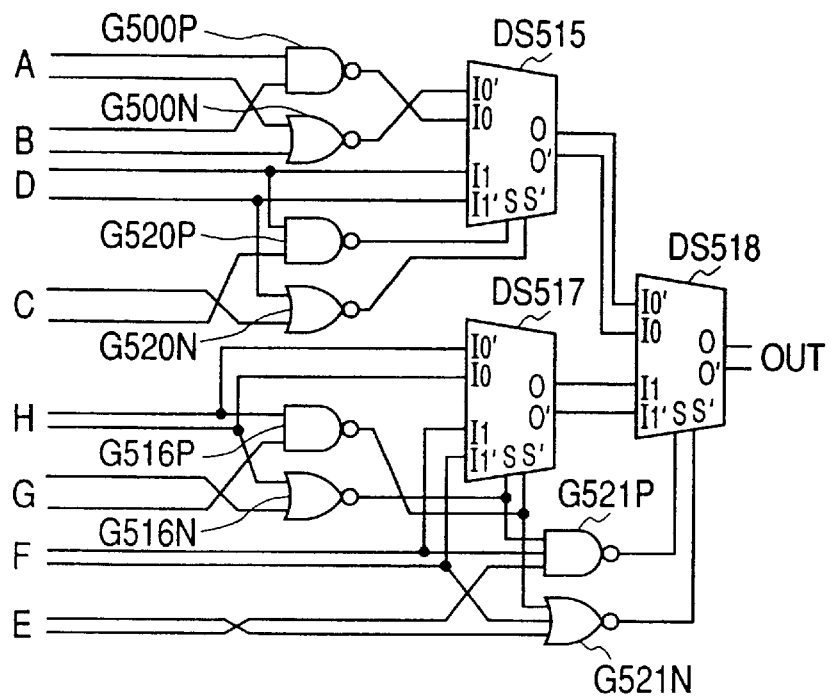
FIG. 26 is a circuit diagram of a circuit (composed of differential selectors) output finally by the CMOS cell re-mapping routine of the delay time improvement program, which uses the logic circuit of the present invention shown in FIG. 16.

In the circuit shown in FIG. 3, which is obtained using the delay time improvement routine in (3), the selectors S512, S500, S515, S514, and S519 are equivalent to the circuits shown in the a-row in FIG. 6. Consequently, each of those selectors can be replaced with an AND gate composed of a CMOS circuit thereby obtaining the circuit shown in FIG. 24. In this circuit shown in FIG. 24, the delay time can be reduced by unifying the AND gates G514 and G519 into one 3-input AND gate (G521 shown in FIG. 25). In this circuit shown in FIG. 24, the AND gates (G516 and G519) used to drive the control input S of a selector can be converted to a NAND gate and an inverter thereby to omit the inverter as shown in the a-row in FIG. 8. The inverter is used to drive the control input S. Consequently, it is possible to replace those AND gates with NAND gates (G520 and G521 shown in FIG. 2). Generally, since an AND gate is composed of a NAND gate and an inverter in a CMOS circuit, the NAND gate can reduce its delay time by a value equivalent to one inverter. If the circuit shown in FIG. 24 is converted to the circuit shown in FIG. 25 such way, therefore, the delay time of the entire circuit can further be reduced. The circuit shown in FIG. 25 can be replaced with a differential circuit, thereby converting the circuit finally as shown in FIG. 26, which is composed of differential selectors DS515, DS517, DS518, CMOS gates G500P, G500N, G520P, G520N, G516P, G516N, G521P, and G521N.

TABLE 1

|  | Original Circuit (FIG. 18) | Circuit of Our Invention (FIG. 26) |
| --- | --- | --- |
| Delay Time (ns) | 1.59(1.00) | 0.51(0.32) |
| Steps in Critical Path | 7(1.00) | 3(0.43) |

Figure 16:
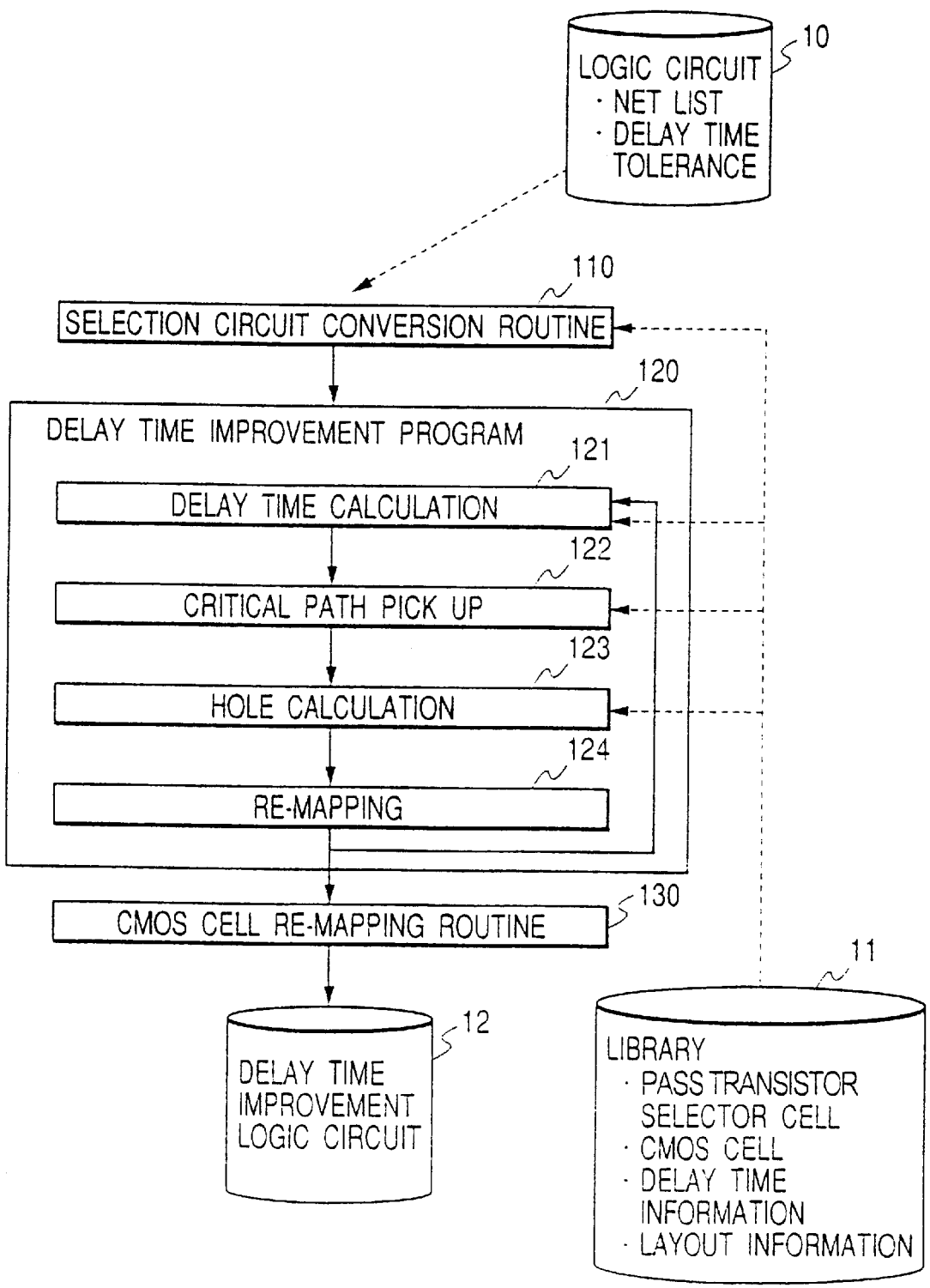
FIG. 16 is a flowchart indicating an execution of the delay time improvement program using the logic circuits of the present invention.

Table 1 shows results of comparison between original circuit and our invention's circuit with respect to the number of steps in a critical path and the delay time of the entire circuit after the delay time is reduced by our invention. As shown in Table 1, the circuit (FIG. 26) whose delay time should be reduced with this method has successfully reduced the number of steps in the critical path up to 3 from 7, which is needed in the original circuit. The delay time could also be reduced successfully to 0.51 ns from 1.59 ns. It will thus be understood that the delay time of a circuit can be reduced surely using the delay time improvement program shown in FIG. 16 in this embodiment. If the delay time of every input signal is equal completely as described here, the number of steps in every path between input signal and output signal becomes 3 steps, so that the circuit shown in FIG. 26 is converted to a well-balanced one.

Although it is premised that the delay time of every input signal is 0 ns in this embodiment so as to simplify the description, the same will also go for a case in which a specific input signal is late from others. In such a case, the delay of the input signal affects the values of both slacks and holes. Consequently, the circuit is converted so that the number of steps in the path related to the late signal input is reduced, thereby the delay time of the entire circuit is reduced.

In the above case, only four types of selectors shown in a- to d-rows in FIG. 6 were re-mapped to CMOS cells, so that the number of steps in each path could be reduced significantly (from 7 to 3 steps) as shown in FIG. 23 using the logic circuits of the present invention. Consequently, even when all the selectors are re-mapped into CMOS cells, it is possible to obtain a logic circuit having less steps in each path and less delay time in the entire circuit than those of the original circuit.

<Sixth Embodiment>

In the fifth embodiment, it was described using a comparatively simple logic circuit (FIG. 18, the number of cells: 7) that the present invention was effective to reduce the delay time of an entire circuit. In this embodiment, however, it will be described that the present invention is also effective for a larger-scale logic circuit.

TABLE 2

|  | Original | Our Invention |
| --- | --- | --- |
| Number of cells | 9712(1.00) | 10699(1.13) |
| Area ($\mu m2$) | 847848(1.00) | 931376(1.10) |
| Max. tolerance violations(ns) | 1.42(1.00) | 0.98(0.69) |
| Tolerance violating paths | 1321(1.00) | 258(0.20) |

Table 2 shows results of comparison between original circuit and our invention's circuit with respect to the number of cells, area, max. tolerance violations, and the number of paths violating a predetermined tolerance after the delay time of the original circuit is reduced through the use of the present invention. This comparison was executed for an actual large-scale logic circuit. The computer system shown in FIG. 14 was used to improve the delay time of the large-scale logic circuit (number of cells: 9712) through the use of the present invention. As shown in this table, the number of cells and the area of the circuit were increased by about 10%. Before the present invention was applied to the circuit, however, the delay time was over a predetermined tolerance and there were 1321 paths in total, which violated the tolerance. Furthermore, the path of 1.42 ns in the maximum original delay time was reduced up to 0.98 ns and the number of paths violating the tolerance was reduced up to 258 after the logic circuits of the present invention were applied.

Figure 27:
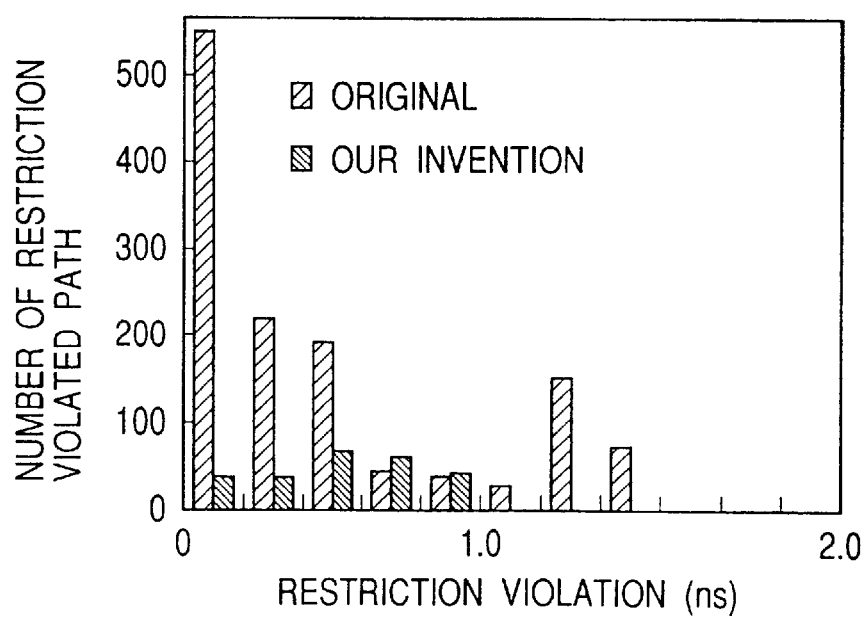
FIG. 27 shows results of comparison performed for a large scale logic circuit between before and after an execution of the delay time improvement program, which uses the logic circuit of the present invention shown in FIG. 16, with respect to the number of paths breaking a predetermined tolerance.

FIG. 27 shows results of comparison between before and after the present invention was applied with respect to the distribution of tolerance violating paths. As shown in FIG. 27, after the present invention was applied, there was no path whose delay time was over 1.0 ns, which was a predetermined tolerance. Since the number of paths whose delay times was 0.2 ns or under (predetermined tolerance) was respectively also reduced significantly. It will thus be understood that the delay time of every path could be reduced surely.

Figure 28:
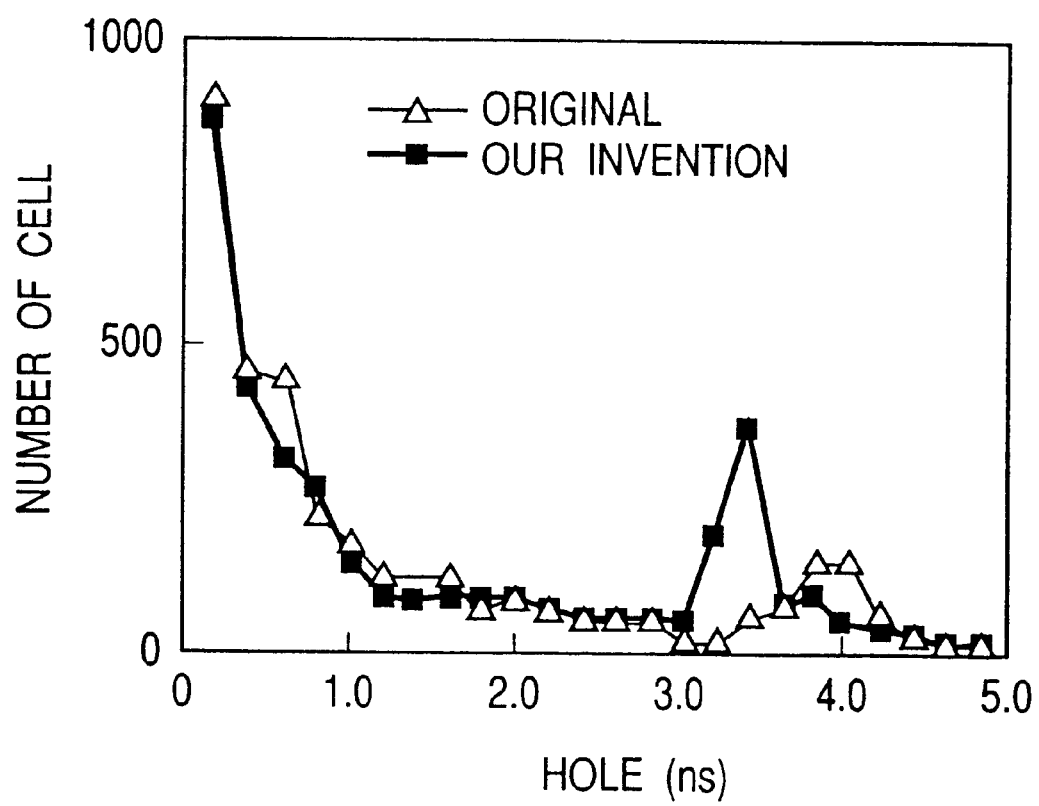
FIG. 28 shows results of comparison performed for a large scale logic circuit between before and after an execution of the delay time improvement program, which uses the logic circuit of the present invention shown in FIG. 16, with respect to a distribution of cell holes.

FIG. 28 shows results of comparison between before and after the present invention was applied with respect to the distribution of holes in cells. According to the delay time improvement method of the present invention shown in FIG. 16, a newly defined quantity referred to as holes is used as an index for re-mapping a circuit having holes into a selector-based circuit thereby reducing the delay time. In this case, however, the delay time is increased in some other paths in the re-mapped circuit, although the delay time of the critical path is reduced surely.

This means that if the delay time of an entire circuit is reduced through the use of holes, the peak of the hole distribution is moved from around 4.0 ns to 3.4 ns as shown in FIG. 28 after the present invention is applied. It will thus be understood that using holes such way is very effective to reduce the delay time of an entire circuit.

As shown clearly in the results of the above comparisons, the delay time improvement method, which uses the logic circuits of the present invention, is very effective even for actual large scale logic circuits.

It will thus be understood clearly through the above embodiments that the present invention, which uses logical circuits, can make it possible to generate a logic circuit having no critical path whose delay time is extremely large by re-mapping the circuit through the use of a logic circuit of the present invention so that the number of steps is arranged equally in each path. Consequently, the present invention can provide a fast logic circuit.

In addition, even when a specific input signal is entered far later than others, re-mapping the circuit through the use of a logic circuit of the present invention is effective to convert the circuit so as to be provided with less steps in the path related to the late input signal and cope with an increase of the delay time caused by such a delay of the input signal. The present invention can thus provide a fast logic circuit.

What is claimed is:

1. A method for forming a logic circuit by using a computer, comprising the steps of:

inputting a first data of a first logic circuit which is described by a first set of CMOS cells and connecting relationships of the first set of CMOS cells;

generating a second data which describes a first logic function of the first logic circuit by a first set of selectors and connecting relationships of said first set of selectors;

replacing a part of the first set of selectors and connecting relationships relating to the part of the first set of selectors into a second set of selectors and connecting relationships relating to the second set of selectors, so that a third data is generated;

wherein the third data is able to use to generate second data of a second logic circuit which is described by a second set of CMOS cells and connecting relationships of the second set of CMOS cells.

2. A method of forming a logic circuit according to claim 1, wherein at least a delay time of a first path from a first input terminal of one of the first set of selectors and a first output terminal of another of the first set of selectors is longer than a delay time of second path corresponding to the first path from a second input terminal of one of the second set of selectors and a second output terminal of another of the second set of selectors, wherein the second input terminal is corresponding to the first input terminal and the second out put terminal is corresponding to the first output terminal.

3. A method of forming a logic circuit according to claim 2, wherein the first path has the longest delay time from any of input terminals of one of the first set of selectors and any of output terminal of another of the first set of selectors.

4. A method of forming a logic circuit according to claim 1, wherein each of the first and second set of selectors has two input terminals and one output terminal.

5. A method of forming a logic circuit according to claim 1, wherein the first set of selectors has at least two selectors.

* * * * *